United States Patent
Deng

(10) Patent No.: US 11,201,442 B2
(45) Date of Patent: Dec. 14, 2021

(54) POWER OVER ETHERNET SYSTEM, DEVICE, AND METHOD

(71) Applicant: ZHEJIANG DAHUA TECHNOLOGY CO., LTD., Zhejiang (CN)

(72) Inventor: Zhiji Deng, Hangzhou (CN)

(73) Assignee: ZHEJIANG DAHUA TECHNOLOGY CO., LTD., Hangzhou (CN)

( * ) Notice: Subject to any disclaimer, the term of this patent is extended or adjusted under 35 U.S.C. 154(b) by 46 days.

(21) Appl. No.: 16/285,154

(22) Filed: Feb. 25, 2019

(65) Prior Publication Data

US 2019/0190217 A1  Jun. 20, 2019

Related U.S. Application Data

(63) Continuation of application No. PCT/CN2017/098124, filed on Aug. 18, 2017.

(30) Foreign Application Priority Data

| Aug. 26, 2016 | (CN) | 201610742862.0 |
| Aug. 26, 2016 | (CN) | 201620956994.9 |
| Dec. 9, 2016 | (CN) | 201621349048.4 |

(51) Int. Cl.
*H01R 24/64* (2011.01)
*H04L 12/02* (2006.01)
(Continued)

(52) U.S. Cl.
CPC ............. *H01R 24/64* (2013.01); *H01R 24/40* (2013.01); *H01R 31/06* (2013.01);
(Continued)

(58) Field of Classification Search
CPC ...... H01R 24/64; H01R 24/244; H01R 31/06; H03H 7/0161
(Continued)

(56) References Cited

U.S. PATENT DOCUMENTS 6,203,333 B1 * 3/2001 Medina .............. H01R 13/6658
439/465
7,441,133 B2 * 10/2008 Giat ........................ H04L 12/10
713/300
(Continued)

FOREIGN PATENT DOCUMENTS

| CN | 1405988 A | 3/2003 |
| CN | 101309152 A | 11/2008 |

(Continued)

OTHER PUBLICATIONS

International Search Report in PCT/CN2017/098124 dated Nov. 24, 2017, 4 Pages.

(Continued)

*Primary Examiner* — Alexander Gilman
(74) *Attorney, Agent, or Firm* — Metis IP LLC

(57) ABSTRACT

The present disclosure relates to a converter. The converter may include a first connector configured to transmit one or more signals, a second connector configured to receive the one or more signals, a first cable with a first impedance, a second cable with a second impedance, and an impedance module. The first connector may be connected to the impedance module via the first cable. The second connector may be connected to the impedance module via the second cable. The impedance module may be configured to convert the first impedance of the first cable to the second impedance of the second cable such that the one or more signals are transmitted from the first connector to the second connector via the first cable and the second cable.

17 Claims, 22 Drawing Sheets

(51) Int. Cl.
*H01R 31/06* (2006.01)
*H04L 12/46* (2006.01)
*H04N 5/232* (2006.01)
*H04L 12/10* (2006.01)
*H01R 24/40* (2011.01)
*H03H 7/01* (2006.01)
*H01R 13/6473* (2011.01)

(52) U.S. Cl.
CPC ......... *H03H 7/0161* (2013.01); *H04L 12/02* (2013.01); *H04L 12/10* (2013.01); *H04L 12/4625* (2013.01); *H04N 5/23241* (2013.01); *H04N 5/23245* (2013.01); *H01R 13/6473* (2013.01)

(58) Field of Classification Search
USPC .......................................................... 439/578
See application file for complete search history.

(56) References Cited

U.S. PATENT DOCUMENTS

| | | | | |
|---|---|---|---|---|
| 7,989,946 | B2* | 8/2011 | Braunisch | H01L 23/66 257/693 |
| 8,742,814 | B2* | 6/2014 | Binder | H04R 17/00 327/261 |
| 9,026,036 | B2* | 5/2015 | Saban | H04W 88/085 455/7 |
| 9,052,482 | B1* | 6/2015 | Siddhaye | G02B 6/4293 |
| 9,325,126 | B2* | 4/2016 | Lee | H01R 31/065 |
| 9,329,605 | B2* | 5/2016 | Pereira | G05D 23/1924 |
| 9,690,343 | B2* | 6/2017 | Teeter | G06F 1/266 |
| 9,755,852 | B2* | 9/2017 | Fischer | H04L 12/413 |
| 10,146,022 | B1* | 12/2018 | Beard | H04B 10/25 |
| 10,381,790 | B1* | 8/2019 | Andrews | H01R 24/64 |
| 2005/0010954 | A1* | 1/2005 | Binder | H04Q 11/04 725/78 |
| 2007/0010132 | A1* | 1/2007 | Nelson | H01R 13/6658 439/577 |
| 2008/0051158 | A1* | 2/2008 | Male | H04L 25/0278 455/572 |
| 2008/0073980 | A1* | 3/2008 | Wang | H01R 13/6675 307/140 |
| 2008/0168283 | A1* | 7/2008 | Penning | G06F 1/263 713/310 |
| 2008/0256598 | A1* | 10/2008 | Diab | H04L 12/10 726/2 |
| 2008/0317472 | A1* | 12/2008 | Park | H04B 3/542 398/115 |
| 2009/0235096 | A1* | 9/2009 | Thomas | H04L 12/10 713/310 |
| 2011/0217873 | A1* | 9/2011 | Diab | H01R 13/66 439/620.01 |
| 2012/0045928 | A1* | 2/2012 | Caveney | H01R 13/641 439/488 |
| 2012/0069743 | A1* | 3/2012 | Carroll | H04L 41/22 370/252 |
| 2013/0077271 | A1* | 3/2013 | Kuhar | H01R 13/701 361/759 |
| 2013/0288526 | A1* | 10/2013 | Rascon | H01R 13/6581 439/607.35 |
| 2014/0293994 | A1* | 10/2014 | Pepe | H01B 11/08 370/352 |
| 2014/0322969 | A1* | 10/2014 | Palinkas | H01R 9/0527 439/578 |
| 2015/0222125 | A1* | 8/2015 | Brunker | H02J 3/02 307/42 |
| 2015/0334186 | A1* | 11/2015 | Chen | H04N 7/183 348/143 |
| 2016/0020911 | A1* | 1/2016 | Sipes, Jr | H04N 5/63 398/16 |
| 2016/0164229 | A1* | 6/2016 | Boban | H01R 31/065 439/620.22 |
| 2016/0187951 | A1* | 6/2016 | Buckmeier | H04L 12/10 713/300 |
| 2017/0244188 | A1* | 8/2017 | Chan | H01R 13/405 |
| 2018/0129257 | A1* | 5/2018 | Stewart | H01R 4/12 |
| 2018/0159336 | A1* | 6/2018 | Dedourek | H04L 12/10 |
| 2018/0191158 | A1* | 7/2018 | Chappell | H04L 12/40045 |
| 2018/0254586 | A1* | 9/2018 | Valenti | H01R 12/585 |
| 2018/0254931 | A1* | 9/2018 | Gardner | H04L 25/0266 |
| 2018/0284860 | A1* | 10/2018 | Haussermann | G06F 1/266 |
| 2019/0073884 | A1* | 3/2019 | Payne | G01R 1/20 |
| 2019/0146169 | A1* | 5/2019 | Grandidge | H01B 9/005 375/257 |

FOREIGN PATENT DOCUMENTS

| | | |
|---|---|---|
| CN | 201629463 U | 11/2010 |
| CN | 201781589 U | 3/2011 |
| CN | 201854447 U | 6/2011 |
| CN | 103873262 A | 6/2014 |
| CN | 106374306 A | 2/2017 |
| CN | 206100208 U | 4/2017 |
| CN | 206332746 U | 7/2017 |
| GB | 2530567 A | 3/2016 |
| KR | 20020053400 A | 7/2002 |
| WO | 2001069925 A1 | 9/2001 |
| WO | 2014037351 A1 | 3/2014 |
| WO | 2018095084 A1 | 5/2018 |

OTHER PUBLICATIONS

Written Opinion in PCT/CN2017/098124 dated Nov. 24, 2017, 6 Pages.

Extended European Search Report in European Application No. 17842859.5 dated Sep. 3, 2019, 9 pages.

* cited by examiner

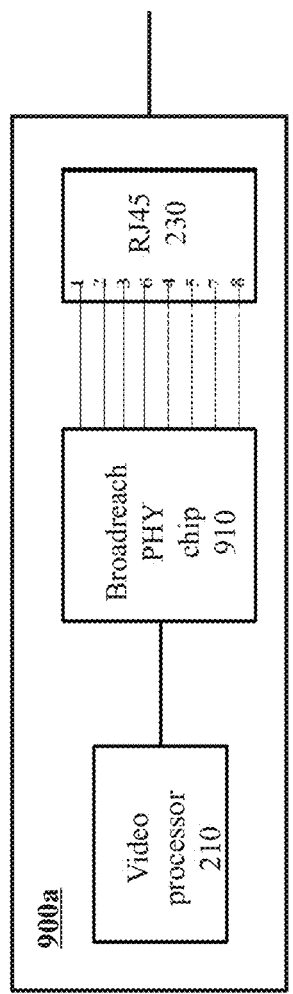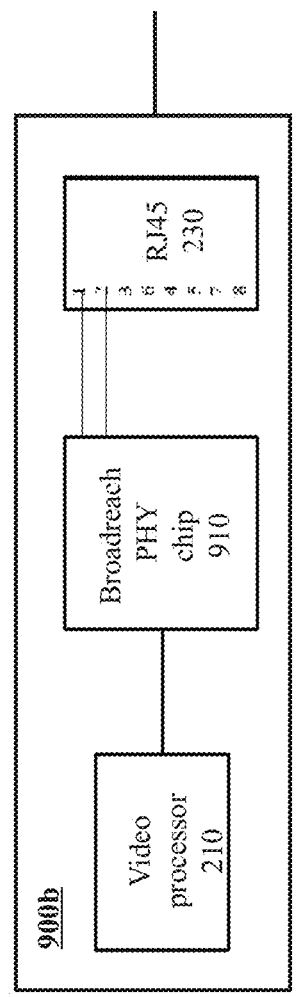

POWER OVER ETHERNET SYSTEM, DEVICE, AND METHOD

CROSS-REFERENCE TO RELATE APPLICATION

This application is a Continuation of International Application No. PCT/CN2017/098124, filed on Aug. 18, 2017, claims priority of Chinese Patent Application No. 201620956994.9 filed on Aug. 26, 2016, Chinese Patent Application No. 201610742862.0 filed on Aug. 26, 2016, and Chinese Patent Application No. 201621349048.4 filed on Dec. 9, 2016. Each of the above-referenced applications is expressly incorporated by reference in their entireties.

TECHNICAL FIELD

The present disclosure generally relates to communications technology, and more particularly, to a passive converter system in communication technology.

BACKGROUND

A Power over Ethernet (PoE) technology may be used to transmit data and electric power to a terminal device of Ethernet. A traditional PoE system may include power sourcing equipment (PSE) and a powered device (PD). The powered device may be a terminal device that receives power supply from the power sourcing equipment. The powered device may include an IP phone, a notebook computer, an IP camera, a Wireless Local Area Network access point, or the like, or a combination thereof. The power sourcing equipment and the powered device may be connected by a network cable. The network cable may have a plurality of (e.g., four, etc.) twisted pairs of lines. For example, as shown in FIG. 4, PoE system 400 may include power sourcing equipment 410 and a powered device 420. Power sourcing equipment 410 may include a port physical layer (PHY) chip 430a, an RJ45 connector 230a, and a PSE module 440. Powered device 420 may include a PHY chip 430b, an RJ45 connector 230b, and a PD module 450. Direct current may be transmitted from power sourcing equipment 410 to powered device 420 through the two twisted pairs of lines (e.g., the pair of lines 1 and 2 and the pair of lines 3 and 6).

A coaxial cable has been widely used in data and electricity transmission. To establish a PoE system based on a coaxial cable, the PoE system may need to include a converter. The converter can convert a network cable impedance to a coaxial cable impedance or convert a coaxial cable impedance to a network cable impedance so that data and electricity can be transmitted on both of the network cable and the coaxial cable.

As shown in FIG. 5, PoE system 500 may include power sourcing equipment 410, a powered device 420, and two active converters 125 (i.e., an active converter 240a and an active converter 240b). Active converter 240a may include a programmable logic controller (PLC) 510a, a PD module 450a, an RJ45 connector 230c, and a Bayonet Neill-Concelman (BNC) connector 340a. Active converter 240b may include a programmable logic controller (PLC) 510b, a PSE module 440b, an RJ45 connector 230d, and a BNC connector 340b. Power sourcing equipment 110 and active converter 240a may be connected by a network cable. Powered device 420 and active converter 240b may be connected by a network cable. Active converter 240a and active converter 240b may be connected by a coaxial cable. Active converter 240a may convert a network cable impedance to a coaxial cable impedance. Active converter 240b may convert a coaxial cable impedance to a network cable impedance. In that way, data and direct current can be transmitted on both the network cable and the coaxial cable. However, PLC 510a and PLC 510b can only operate when they are powered. Moreover, the working principle of a PLC is complicated.

An IP camera is a common powered device. A traditional IP camera needs to be equipped with various connectors to connect to different transmission media. For example, an IP camera needs to be equipped with an RJ45 connector to be connected to a standard network cable (e.g., a Category 5) whose transmission distance is up to 100 meters, or a network cable whose maximum transmission distance is longer than 100 meters. As another example, an IP camera needs to be equipped with a coaxial connector (e.g., a Bayonet Neill-Concelman (BNC) connector) to be connected to a coaxial cable.

To solve the above problem, an IP camera may be equipped with an active convertor. As shown in FIG. 2, IP camera 200 may include a video processor 210, a regular PHY chip 220, and an RJ45 connector 230. IP camera 200 may be connected to an active convertor 240. Active convertor 240 can convert RJ45 connector 230 to a connector that can be connected to a coaxial cable or an enhanced network cable. Another example is to equip an IP camera with an interface chip and a switch. As shown in FIG. 3, IP camera 300 may include a regular PHY chip 220, an enhanced interface chip 310, a coaxial interface chip 320, a switch 330, an RJ45 connector 230, and a BNC connector 340. Switch 330 may switch modes of RJ45 connector 230 so that RJ45 connector 230 can support both a regular mode and an enhanced mode. BNC connector 340 may enable IP camera 125 to be connected to a coaxial cable. IP camera 125 may connect to different transmission media based on the above traditional solutions. However, the traditional solutions are costly and may make the structure of IP camera 125 complicated.

Thus, it may be desirable to develop a technology to make it possible to transmit one or more signals on different transmission media (e.g., a network cable, a coaxial cable, etc.).

SUMMARY

According to an aspect of the present disclosure, a converter is provided. The converter may include a first connector configured to transmit one or more signals, a second connector configured to receive the one or more signals, a first cable with a first impedance, a second cable with a second impedance, and an impedance module. The first connector may be connected to the impedance module via the first cable. The second connector may be connected to the impedance module via the second cable. The impedance module may be configured to convert the first impedance of the first cable to the second impedance of the second cable such that the one or more signals are transmitted from the first connector to the second connector via the first cable and the second cable.

In some embodiments, the first connector may be a first network connector and the second connector may be a coaxial connector. The first cable may be a network cable and the second cable may be a first coaxial cable. The first impedance may be a network cable impedance, and the second impedance may be a coaxial cable impedance.

In some embodiments, the one or more signals may include a power signal and a network signal.

In some embodiments, the converter may include a high pass module and a low pass module. The high pass module may transmit the network signal between the impedance module and the coaxial connector and suppress the power signal between the impedance module and the coaxial connector. The low pass module may transmit the power signal between the impedance module and the coaxial connector and suppress the network signal between the impedance module and the coaxial connector.

In some embodiments, the first network connector may include a first interface and a second interface. The impedance module may include a first end of the impedance module, a second end of the impedance module, a third end of the impedance module, and a fourth end of the impedance module. The high pass module may include a first end of the high pass module and a second end of the high pass module. The first end of the impedance module may be connected with the first interface of the first network connector. The second end of the impedance module may be connected with the second interface of the first network connector. The third end of the impedance module may be connected with a first end of the high pass module. The fourth end of the impedance module may be connected with a second end of the high pass module.

In some embodiments, the first network connector may include a third interface, a fourth interface, and a fifth interface. The impedance module may include a fifth end of the impedance module. The coaxial connector may include a first end of the coaxial connector and a second end of the coaxial connector. The high pass module may include a third end of the high pass module and a fourth end of the high pass module. The low pass module may include a first end of the low pass module, a second end of the low pass module, a third end of the low pass module, and a fourth end of the low pass module. The first end of the low pass module may be connected to a connection between the third end of the high pass module and the first end of the coaxial connector. The second end of the low pass module may be connected to a connection between the fourth end of the high pass module and the second end of the coaxial connector. The third end of the low pass module may be connected to the fifth end of the impedance module or the third interface of the first network connector. The fourth end of the low pass module may be connected to the fourth interface or the fifth interface of the first network connector.

In some embodiments, the first network connector may include an RJ45 connector with a first pin, a second pin, a third pin, a fourth pin, a fifth pin, a sixth pin, a seventh pin, and an eighth pin. The first pin may form the first interface of the first network connector. The second pin may form the second interface of the first network connector. The fourth pin and the fifth pin may be short-circuited to form the third interface of the first network connector. The third pin and the sixth pin may be short-circuited to form the fourth interface of the first network connector. The seventh pin and the eighth pin may be short-circuited to form the fifth interface of the first network connector.

In some embodiments, the impedance module may include a voltage transformer with a first winding and a second winding. The first winding may include a first end of the first winding, a second end of the first winding, and a mid-tap of the first winding. The second winding may include a first end of the second winding and a second end of the second winding. The first end of the first winding may form the first end of the impedance module. The second end of the first winding may form the second end of the impedance module. The mid-tap of the first winding may form the fifth end of the impedance module. The first end of the second winding may form the third end of the impedance module. The second end of the second winding may form the fourth end of the impedance module.

In some embodiments, the high pass module may include a first capacitor and a second capacitor. The first capacitor may include a first end of the first capacitor and a second end of the first capacitor. The second capacitor may include a first end of the second capacitor and a second end of the second capacitor. The first end of the first capacitor may form the first end of the high pass module. The second end of the first capacitor may form the third end of the high pass module. The first end of the second capacitor may form the second end of the high pass module. The second end of the second capacitor may form the fourth end of the high pass module.

In some embodiments, the high pass module may include a sixth end of the high pass module and a seventh end of the high pass module. The coaxial connector may include a third end of the coaxial connector and a fourth end of the coaxial connector. The sixth end of the high pass module may be connected to the third end of the coaxial connector. The seventh end of the high pass module may be connected to the fourth end of the coaxial connector.

In some embodiments, the low pass module may include a first inductor and a second inductor. The first inductor may include a first end of the first inductor and a second end of the first inductor. The second inductor may include a first end of the second inductor and a second end of the second inductor. The low pass module may include a fifth end of the low pass module, a sixth end of the low pass module, a seventh end of the low pass module, and an eighth end of the low pass module. The first end of the first inductor may form the fifth end of the low pass module. The first end of the second inductor may form the sixth end of the low pass module. The second end of the first inductor may form the seventh end of the low pass module. The second end of the second inductor may form the eighth end of the low pass module. The fifth end of the low pass module and the sixth end of the low pass module may be coupled to the first network connector. The seventh end of the low pass module and the eighth end of the low pass module may be coupled to the coaxial connector.

In some embodiments, the first network connector of the converter may be connected to an IP camera. The IP camera may include a video processor, a physical layer chip, and a second network connector.

In some embodiments, the physical layer chip of the IP camera may include a regular mode and an enhanced mode. The physical layer chip may operate in the regular mode when the physical layer chip is connected to a standard network cable. The physical layer chip may operate in the enhanced mode when the physical layer chip is connected to an enhanced network cable.

In some embodiments, the physical layer chip may operate in the regular mode when the physical layer chip of the IP camera is connected to the second network connector by four pairs of lines.

In some embodiments, the physical layer chip may operate in the enhanced mode when the physical layer chip of the IP camera is connected to the second network connector by a pair of lines.

In some embodiments, the first network connector of the converter may be connected to the second network connector of the IP camera.

In some embodiments, the IP camera may transmit a video signal to the first network connector of the converter. The first network connector may transmit the video signal to the impedance module. The impedance module may transmit the video signal to the coaxial connector.

In some embodiments, the coaxial connector of the converter may be connected to a second coaxial cable. The coaxial connector may transmit the video signal to the second coaxial cable.

In some embodiments, the video processor may be connected to the physical layer chip via a media independent interface.

In some embodiments, the physical layer chip may be a broadreach physical layer chip.

In some embodiments, the first network connector of the converter or the second network connector of the IP camera may be an RJ45 connector.

According to another aspect of the present disclosure, a Power over Ethernet (POE) system may be provided. The POE system may include a first converter and a second converter. The first converter may include a first connector configured to transmit one or more signals, a second connector configured to receive the one or more signals, a first cable with a first impedance, a second cable with a second impedance, and a first impedance module. The second converter may include a third connector configured to transmit one or more signals, a fourth connector configured to receive the one or more signals, a third cable with a third impedance, a fourth cable with a fourth impedance, and a second impedance module. The first connector may be connected to the first impedance module via the first cable. The second connector may be connected to the first impedance module via the second cable. The first impedance module may be configured to convert the first impedance of the first cable to the second impedance of the second cable such that the one or more signals are transmitted from the first connector to the second connector via the first cable and the second cable. The third connector may be connected to the second impedance module via the third cable. The fourth connector may be connected to the second impedance module via the fourth cable. The second impedance module may be configured to convert the third impedance of the third cable to the fourth impedance of the fourth cable such that the one or more signals are transmitted from the third connector to the fourth connector via the third cable and the fourth cable. An end of the second connector of the first converter may be connected to an end of the fourth connector of the second converter via a fifth cable.

According to another aspect of the present disclosure, an IP camera may be provided. The IP camera may include a video processor, a physical layer chip, and a network connector. The physical layer chip may have a regular mode and an enhanced mode. The physical layer chip operates in the regular mode when the physical layer chip is connected to a standard network cable. The physical layer chip operates in the enhanced mode when the physical layer chip is connected to an enhanced network cable.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 9a illustrates an exemplary IP camera in a regular mode according to some embodiments of the present disclosure;

FIG. 9b illustrates an exemplary IP camera in an enhanced mode according to some embodiments of the present disclosure;

DETAILED DESCRIPTION

Figure 1:
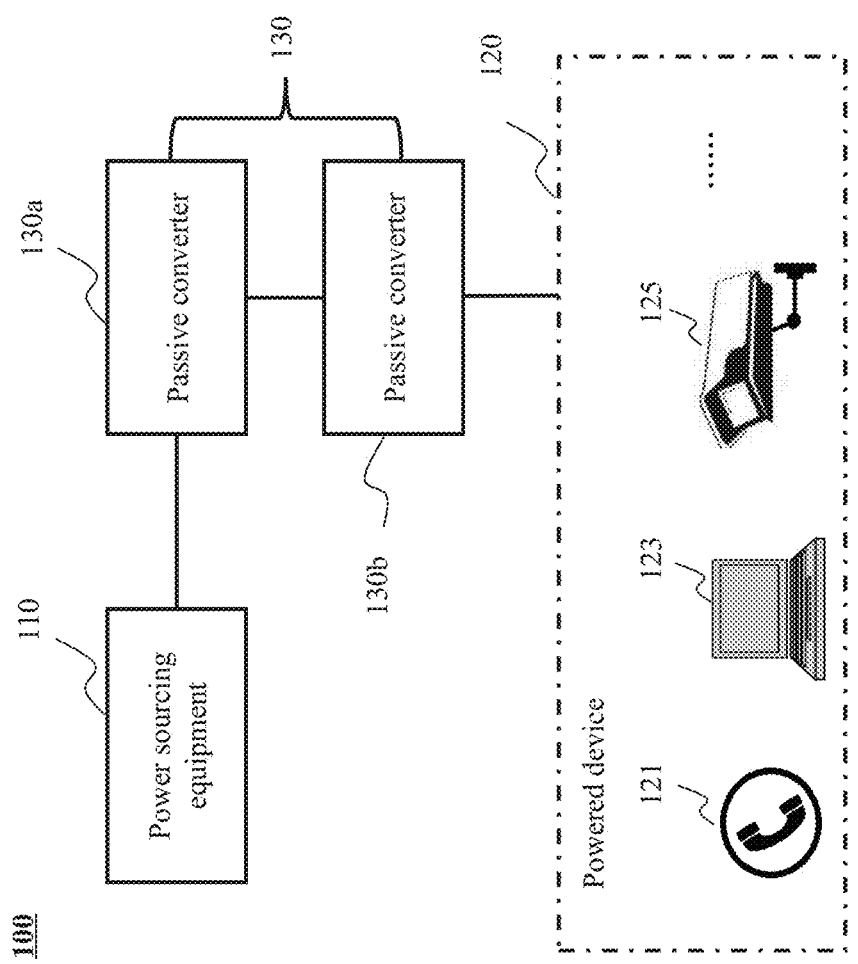
FIG. 1 illustrates a schematic diagram of a power over Ethernet system according to some embodiments of the present disclosure.
Figure 2:
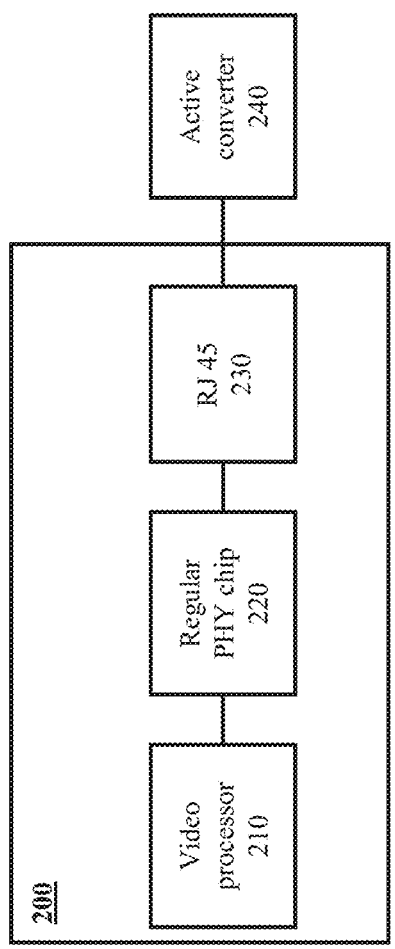
FIG. 2 illustrates an exemplary IP camera connected to an active convertor according to some embodiments of the present disclosure.
Figure 3:
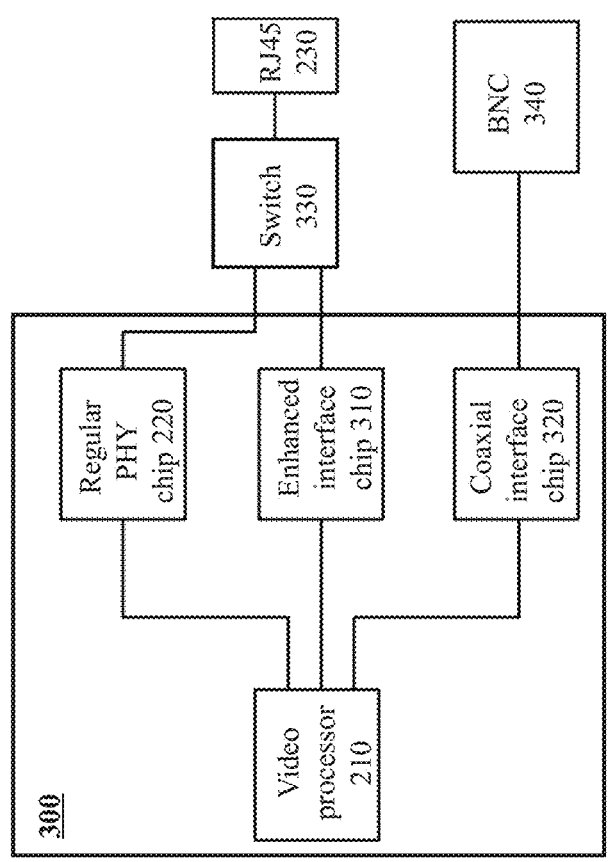
FIG. 3 illustrates an exemplary IP camera connected to a switch and a BNC connector according to some embodiments of the present disclosure.
Figure 4:
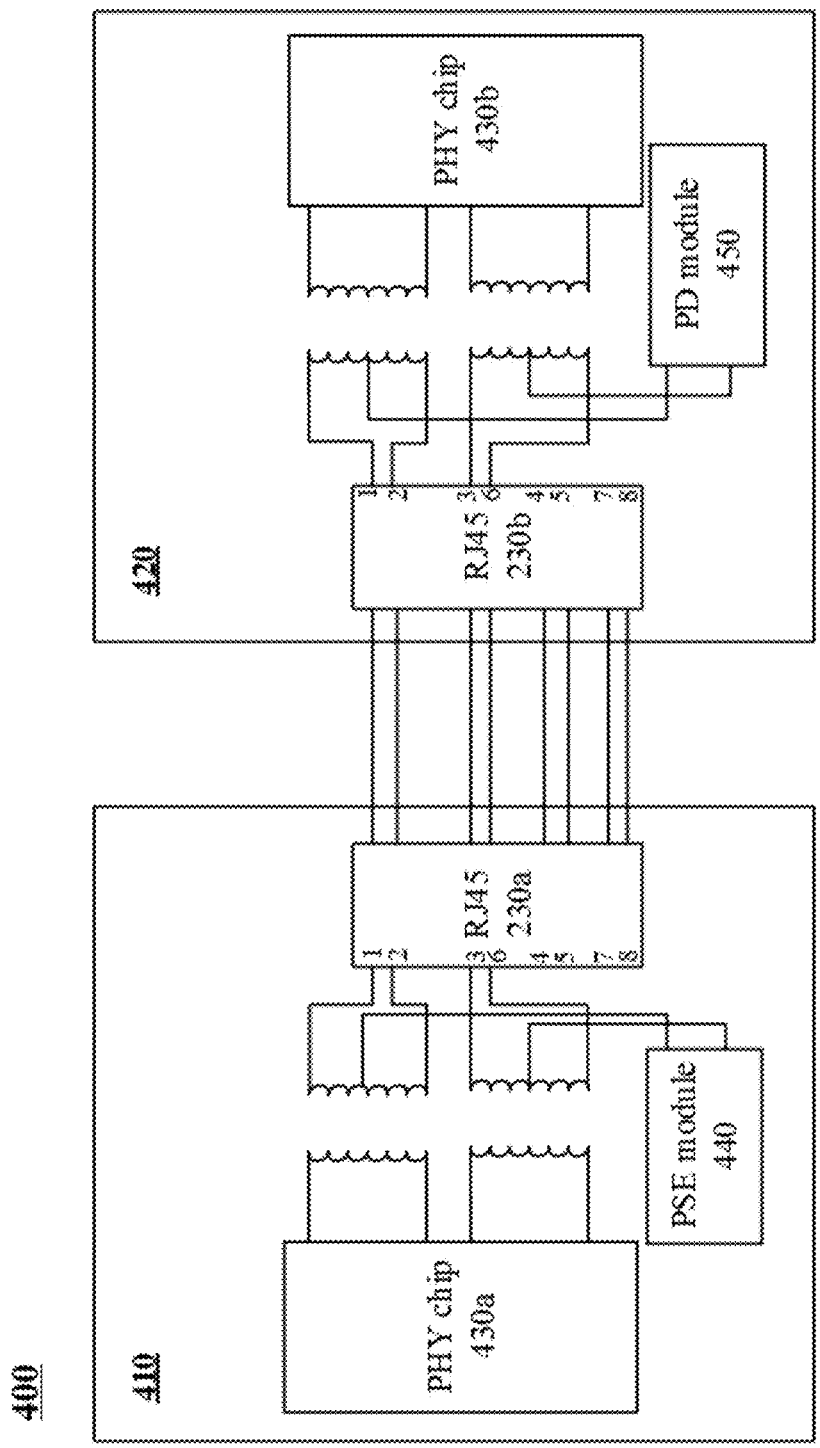
FIG. 4 illustrates an exemplary power over Ethernet system according to some embodiments of the present disclosure.
Figure 5:
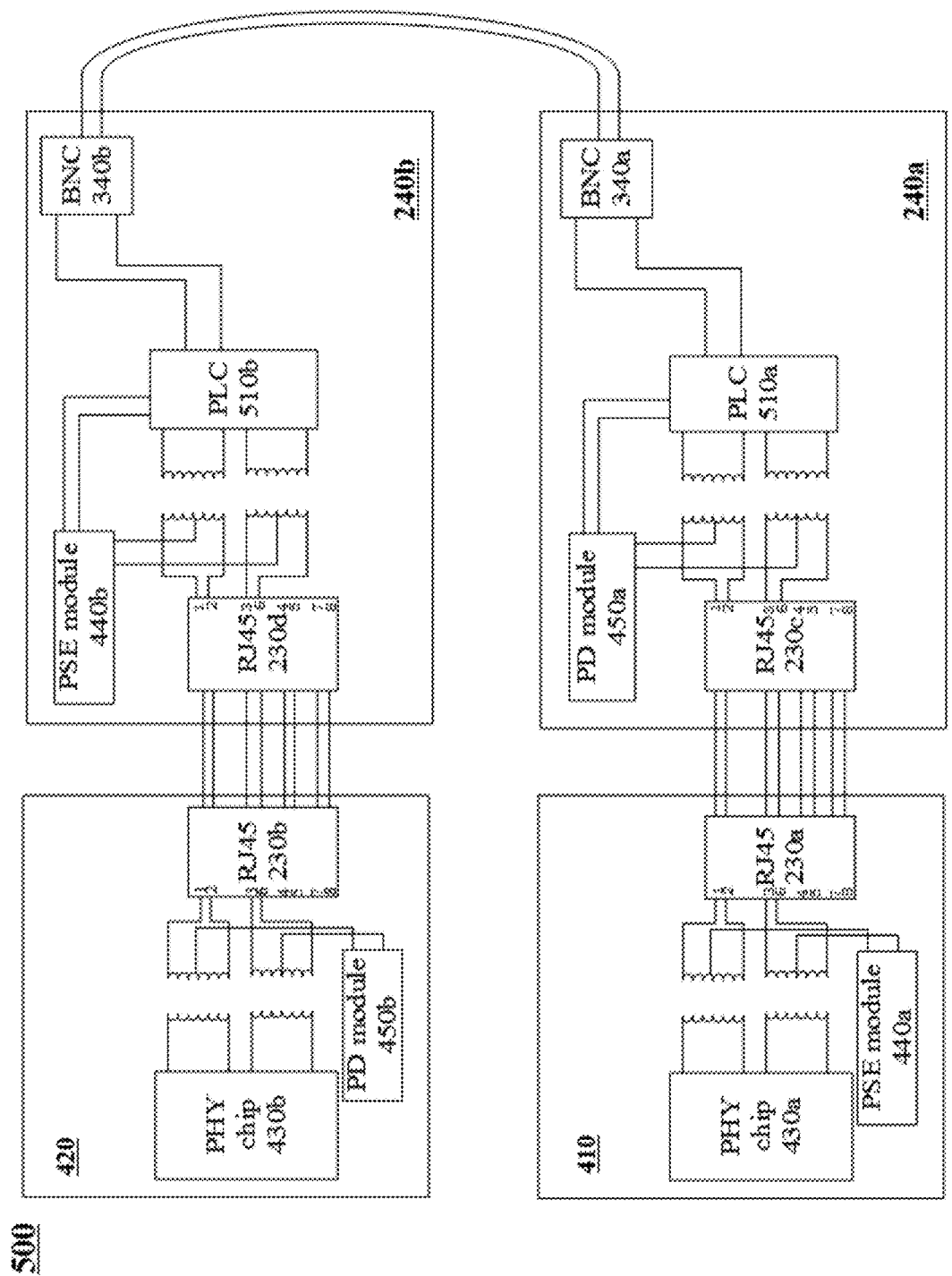
FIG. 5 illustrates an exemplary power over Ethernet system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

It will be understood that the term "system," "engine," "unit," "module," and/or "block" used herein are one method to distinguish different components, elements, parts, section or assembly of different level in ascending order. However, the terms may be displaced by other expression if they may achieve the same purpose.

It will be understood that when a unit, engine, module or block is referred to as being "on," "connected to," or "coupled to" another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

The terminology used herein is for the purposes of describing particular examples and embodiments only, and is not intended to be limiting. As used herein, the singular forms "a," "an," and "the" may be intended to include the plural forms as well, unless the context clearly indicates otherwise. It will be further understood that the terms "include" and/or "comprise," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof.

The present disclosure provided herein relates to communications technology. Specially, the present disclosure relates to a passive converter system in communications technology. According to some embodiments of the present disclosure, the passive converter system may include a network connector, an impedance module, and a coaxial connector. The network connector may input or output one or more signals. The coaxial connector may input or output the one or more signals. The impedance module may converter a coaxial cable impedance to a network cable impedance or convert a network cable impedance to a coaxial cable impedance and transmit the one or more signals between the network connector and the coaxial connector.

FIG. 1 illustrates a schematic diagram of a Power over Ethernet (PoE) system according to some embodiments of the present disclosure. PoE system 100 may include power sourcing equipment 110, a powered device 120, and two or more passive converters 130. Merely by way of example, PoE system 100 may include power sourcing equipment 110, a powered device 120, a passive converter 130a, and a passive converter 130b.

Power sourcing equipment 110 may supply electric power to device 120. The electric power (e.g., a direct current signal, etc.) may be transmitted via a network cable. As used herein, a network cable may refer to a twisted-pair cable. Power sourcing equipment 110 may be used to manage a power supply process in PoE system 100. Power sourcing equipment 110 may be a device such as a network switch (i.e., a PoE network switch) that may supply power to powered devices.

Powered device 120 may be a device powered by power sourcing equipment 110 and may consume electric power. For example, powered device 120 may receive electric power from power sourcing equipment 110. The electric power (e.g., a direct current signal, etc.) may be transmitted via a network cable. Power device 120 may be a terminal device of PoE system 100. Powered device 120 may include an IP phone 121, a notebook computer 123, an IP camera 125, a Wireless Local Area Network access point (not shown in FIG. 1), or the like, or a combination thereof.

Components in PoE system 100 may be connected to or communicate with each other. Merely by way of example, power sourcing equipment 110 and passive converter 130a may be connected to each other by a network cable. Power device 120 and passive converter 130b may be connected to each other by a network cable. The network cable may be a twisted-pair cable. The network cable may be a Category-5 cable, a Category-5e cable, a Category-6 cable, etc. The impedance of a coaxial cable may be any positive number (e.g., 100 ohms, 120 ohms, 150 ohms, etc.) The impedance of the network cable may be determined based on the type of the network cable. For example, the impedance of a Category-5 cable may be 100 ohms. The maximum transmission distance may be any positive number (e.g., 50 meters, 100 meters, 150 meters, etc.). For example, the maximum transmission distance of a network cable may be 100 meters. As used herein, a network cable whose maximum transmission distance is up to 100 meters may be referred to as a standard network cable. As used herein, a network cable whose maximum transmission distance exceeds 100 meters may be referred to as an enhanced network cable.

Passive converter 130a and passive converter 130b may be connected to each other by a coaxial cable. The coaxial cable may be an RG-6 coaxial cable, a 75-5 coaxial cable, an RG-59 coaxial cable, an RG-58 coaxial cable, an RG-62 coaxial cable, an RG-7 coaxial cable, an RG-11 coaxial cable, or the like, or a combination thereof. Merely by way of example, the impedance of a coaxial cable may be 75 ohms, 100 ohms, etc. The impedance of a coaxial cable may be determined based on the type of a coaxial cable. For example, the impedance of an RG-58 coaxial cable may be 50 ohms. As another example, the impedance of an RG-69 coaxial cable may be 75 ohms. The maximum transmission distance of a coaxial cable may be 50 meters, 100 meters, 150 meters, 185 meters, 300 meters, 500 meters, etc. The maximum transmission distance of a coaxial cable may be determined based on the type of a coaxial cable. For example, the maximum transmission distance of an RG-58 coaxial cable may be 185 meters. As another example, the maximum transmission distance of an RG-11 coaxial cable may be 500 meters.

Electric power and data may be transmitted in PoE system 100. The data may include one or more signals (e.g., a network signal, a video signal, an image signal, an audio signal, etc.).

At least a parameter of a network cable and a corresponding parameter a coaxial cable used in PoE system 100 may be the same or different. In some embodiments, the network cable and the coaxial cable may have different impedances. Merely by way of example, the network cable impedance may be 100 ohms, and the coaxial cable impedance may be 75 ohms or 50 ohms. In such a situation, at least one of the network cable impedance and the coaxial cable impedance may need to be converted to a same value as the impedance of the other in order to transmit a signal on both the network cable and the coaxial cable. As used herein, converting a network cable impedance to a coaxial cable impedance means converting the value of the network cable impedance and making the value of the network cable impedance equal to the value of coaxial cable impedance. As used herein, converting a coaxial cable impedance to a network cable impedance means converting the value of the coaxial cable impedance and making the value of coaxial cable impedance be equal to the network cable impedance.

Passive converter 130 may convert a network cable impedance to a coaxial cable impedance, or vice versa. Merely by way of example, passive converter 130a may convert the network cable impedance to the coaxial cable impedance. As another example, passive converter 130b may convert the coaxial cable impedance to the network cable impedance. In this way, electric power (e.g., a direct current signal, etc.) and data (e.g., a video signal, an image signal, an audio signal, etc.) may be transmitted on both the network cable and the coaxial cable. Compared to an active converter, passive converter 130 may operate without a power supply while not reducing the power transmission efficiency of PoE system 100.

Figure 6:
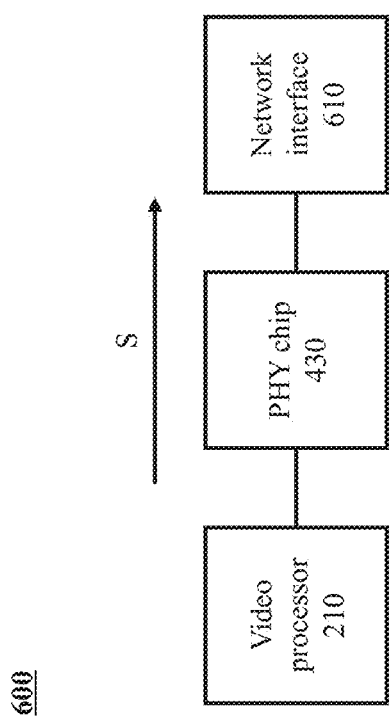
FIG. 6 illustrates an exemplary IP camera according to some embodiments of the present disclosure.

FIG. 6 illustrates an exemplary IP camera according to some embodiments of the present disclosure. IP camera 600 may be an exemplary embodiment of IP camera 125 as shown in FIG. 1. IP camera 600 may include a video processor 210, an enhanced interface 310, and a network interface 610.

Video processor 210 may send a signal S. The signal S may be a control signal or a video signal. PHY chip 430 may receive the signal sent by video processor 210. PHY chip 430 may be a regular PHY chip, an enhanced PHY chip, a universal PHY chip, etc. The regular PHY chip may support a regular Ethernet connection. The enhanced PHY chip may support an enhanced Ethernet connection. The universal PHY chip may support both a regular Ethernet connection and an enhanced Ethernet connection. The regular Ethernet connection may have a bandwidth of 100 Mbps. The enhanced Ethernet connection may have a bandwidth greater than 100 Mbps.

Network interface 610 may be connected to a network cable (e.g., a standard network cable, an enhanced network cable, etc.) and transmit the signal S to the network cable. Network interface 610 may include an RJ-45 connector, an RJ-11 connector, a SC fiber connector, an FDDI connector, an attachment unit interface (AUI) connector, a console connector, or the like, or a combination thereof.

In some embodiments, PHY chip 430 may be a universal PHY chip that support both regular Ethernet and enhanced Ethernet. PHY chip 430 may operate in a regular mode and an enhanced mode. When PHY chip 430 operates in the regular mode, the maximum transmission distance of signal may be up to 100 meter. PHY chip 430 may be connected to a standard network cable when operating in the regular mode. In the regular mode, PHY chip 430 may be connected to network interface 610 through two or four pairs of lines. When PHY chip 430 operates in an enhanced mode, the maximum transmission distance of signal may exceed 100 meters. PHY chip 430 may be connected to an enhanced network cable when operating in an enhanced mode. In the enhanced mode, PHY chip 430 may be connected to network interface 610 through a single pair of lines. The enhanced mode may also be referred to as a single pair of lines mode.

In some embodiments, video processor 210 may be connected to PHY chip 430 through a media independent interface (MII). The MII may include a reduced gigabit media independent interface (RGMII), a gigabit media-independent interface (GMII), a reduced media independent interface (RMII), a serial media independent interface (SMII), a source synchronous serial media independent interface (S3MII), a serial gigabit media-independent interface (SGMII), a Quad serial gigabit media-independent interface (QSGMII), or the like, or a combination thereof.

In some embodiments, PHY chip 430 may be a broadreach PHY chip produced by, for example, BROADCOM CORPORATION. The broadreach PHY chip may be connected to network interface 610 through a media dependent interface (MDI). The broadreach PHY chip may operate in a regular mode or an enhanced mode. The maximum transmission distance of signal S may exceed 300 meters when the broadreach PHY chip operates in an enhanced mode. The maximum transmission distance of signal S may be up to 100 meters when the broadreach PHY chip operates in a regular mode. Merely by way of example, in the regular mode, the broadreach PHY chip may a gigabit PHY chip or a fast PHY chip. The gigabit PHY chip may be connected to network interface 610 through four pairs of lines. The fast PHY chip may be connected to network interface 610 through two pairs of lines. In the enhanced mode, the broadreach PHY chip may conform to the 1000BASE-T1 standard.

In some embodiments, network interface 610 may be an RJ45 connector. The RJ45 connector may have eight pins (i.e., pin 1 to pin 8). The RJ 45 connector may be a connector of a straight cable or a cross cable. The straight cable and the cross cable may have different wire arrangements and may be used to connect different types of devices. The RJ45 connector may be connected to PHY chip 430 through two pairs of lines or four pairs of lines when PHY chip 430 operates in a regular mode. Merely by way of example, the two pairs of lines may be connected to pin 1, pin 2, pin3, and pin 4 of the RJ45 connector. As another example, the two pairs of lines may be connected to pin 1, pin 2, pin3, and pin 6 of the RJ45 connector (as shown in FIG. 9a). The four pairs of lines may be connected to pin 1 to pin 8 of the RJ45 connector. The RJ45 connector may be connected to PHY chip 430 through a single pair of lines when PHY chip 430 operates in an enhanced mode. Merely by way of example, the single pair of lines may be connected to pin 1 and pin 2 of the RJ45 connector (as shown in FIG. 9b).

It should be noted that the descriptions above in relation to IP camera 600 is provided for the purposes of illustration, and not intended to limit the scope of the present disclosure. For persons having ordinary skills in the art, various variations and modifications may be conducted under the guidance of the present disclosure. However, those variations and modifications do not depart the scope of the present disclosure. For example, IP camera 600 may further include an imaging device (e.g., an imaging sensor, etc.), an infrared device, a lens, an optical filter, or the like, or a combination thereof. As another example, PHY chip 430 may be connected to network interface 610 through any number of pairs of lines.

Figure 7:
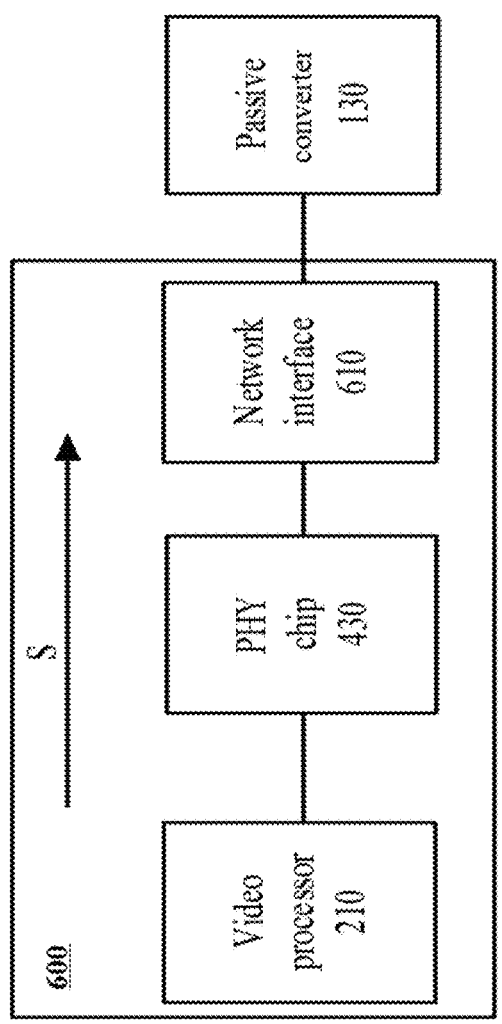
FIG. 7 illustrates an exemplary IP camera connected to an exemplary passive converter according to some embodiments of the present disclosure.

FIG. 7 illustrates an exemplary IP camera connected to an exemplary passive converter 130 according to some embodiments of the present disclosure. IP camera 600 may include a video processor 210, a PHY chip 430, and a network interface 610. More descriptions regarding the IP camera 600 may be found elsewhere in the present disclosure. See, e.g., FIG. 6 and relevant descriptions thereof. As shown in FIG. 7, IP camera 600 may be connected to a passive converter 130 via network interface 610. PHY chip 430 may operate in an enhanced mode when network interface 610 is connected to passive converter 130. Network interface 610 may transmit signal S to a passive converter 130. Passive convert 130 may convert a network cable impedance to a coaxial cable impedance so that the signal S can be transmitted through a coaxial cable.

Figure 8:
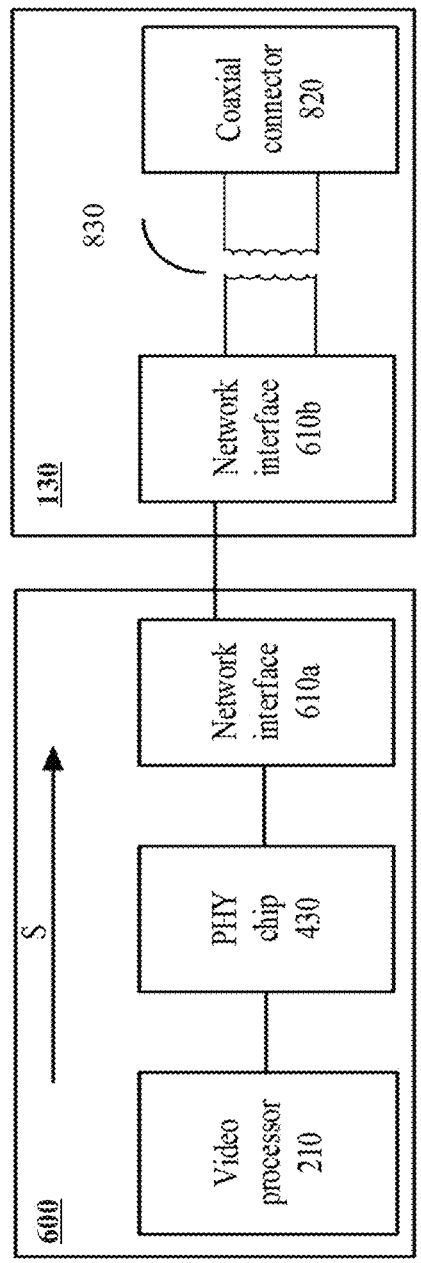
FIG. 8 illustrates an exemplary IP camera connected to an exemplary passive converter according to some embodiments of the present disclosure.

FIG. 8 illustrates an exemplary IP camera connected to an exemplary passive converter 130 according to some embodiments of the present disclosure. IP camera 600 may include a video processor 210, a PHY chip 430, and a network interface 610a. More descriptions regarding the IP camera 600 may be found elsewhere in the present disclosure. See, e.g., FIG. 6 and relevant descriptions thereof.

Passive converter 130 may include a network interface 610b, a coaxial connector 820, and an impedance module 830. A first end of impedance module 830 may be connected to network interface 610b. A second end of impedance module 830 may be connected to coaxial connector 820.

Network interface 610a may be connected to network interface 610b by a network cable and transmit a signal S (e.g., a video signal, etc.) to network interface 610b. Impedance module 830 may receive the signal S from network interface 610b and transmit it to coaxial connector 820. Impedance module 830 may convert a network cable impedance to a coaxial cable impedance. Merely by way of example, the network cable impedance may be 100 ohms and the coaxial cable impedance may be 75 ohms or 50 ohms. In some embodiments, impedance module 830 may be a Balun, a voltage transformer, or the like, or a combination thereof. Coaxial connector 820 may transmit the signal S to a coaxial cable. Coaxial connector 820 may include a BNC connector, a type N coaxial connector, a type F coaxial connector, a Threaded Neill-Concelman (TNC) connector, a Sub Miniature version A(SMA) connector, reverse-polarity SMA connector, a reverse-polarity TNC connector, or the like, or a combination thereof.

Network interface 610a and network 610b may be exemplary embodiments of network interface 610. Network interface 610a and network interface 610b may include network connectors of a same type. Network interface 610a and network interface 610b may include network connectors of different types. In some embodiments, both network interface 610a and network interface 610b may be an RJ45 connector. More descriptions regarding the RJ45 connector may be found elsewhere in the present disclosure. See, e.g., FIG. 6 and relevant descriptions thereof.

FIG. 9a illustrates an exemplary IP camera in a regular mode according to some embodiments of the present disclosure. IP camera 900a illustrated in FIG. 9a may be an exemplary embodiment of IP camera 600 illustrated in FIG. 6. IP camera 900a may include a video processor 210, a broadreach PHY chip 910, and an RJ45 connector 230. Broadreach PHY chip 910 may be connected to RJ45 connector 230 through at least two pairs of lines. In this case, RJ45 connector 230 may be connected to a standard network cable (e.g., a Category 5), and IP camera 900a may operate in a regular mode.

Merely by way of example, broadreach PHY chip 910 may be connected to RJ45 connector 230 through two pairs of lines that are connected to pin 1, pin 2, pin3 and pin 6 of RJ45 connector 230. It should be noted that the way of connection between broadreach PHY chip 910 and RJ45 connector 230 shown in FIG. 9a is provided for the purposes of illustration, and not intended to limit the scope of the present disclosure. Broadreach PHY chip 910 and RJ45 connector 230 may be connected in one or more other ways. For example, broadreach PHY chip 910 may be connected to RJ45 connector 230 through three or four pairs of lines. As another example, broadreach PHY chip 910 may be connected to any pin of RJ45 connector 230.

FIG. 9b illustrates an exemplary IP camera in an enhanced mode according to some embodiments of the present disclosure. IP camera 900b illustrated in FIG. 9b may be an exemplary embodiment of IP camera 600 illustrated in FIG. 6. IP camera 900b may include a video processor 210, a broadreach PHY chip 910, and an RJ45 connector 230. Broadreach PHY chip 910 may be connected to RJ45 connector 230 through at a single pair of lines. In this case, RJ45 connector 230 may be connected to an enhanced network cable, and IP camera 900b may operate in an enhanced mode.

Merely by way of example, broadreach PHY chip 910 may be connected to RJ45 connector 230 through a single pair of lines that are connected to pin 1 and pin 2 of RJ45 connector 230. In some embodiments, the enhanced network cable may be a network cable whose maximum transmission distance is 300 meters. It should be noted that the way of connection between broadreach PHY chip 910 and RJ45 connector 230 shown in FIG. 9b is provided for the purposes of illustration, and not intended to limit the scope of the present disclosure. For example, broadreach PHY chip 910 may be connected to any two pins of RJ45 connector 230.

Figure 9C:
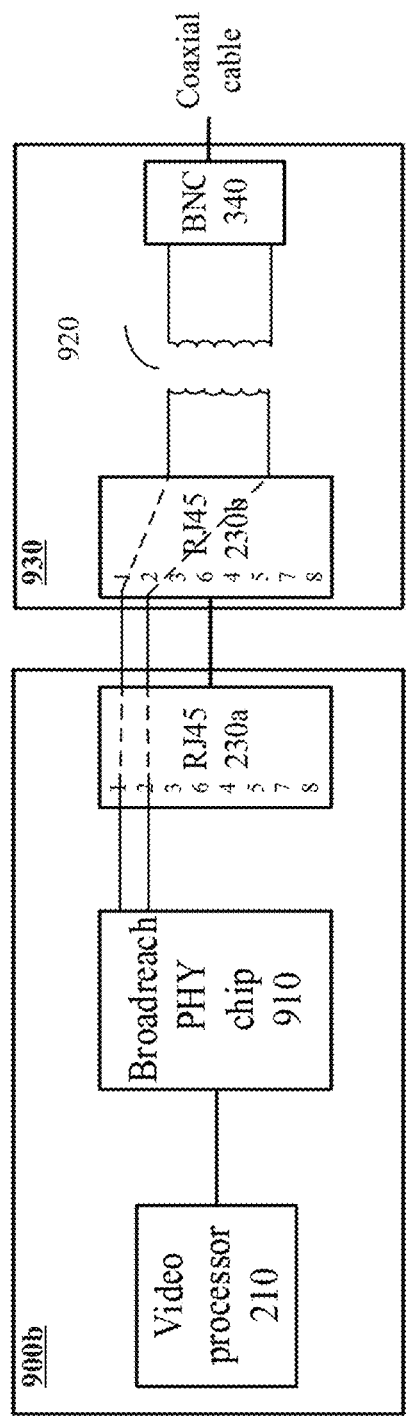
FIG. 9c illustrates an exemplary way of connection between an IP camera and a passive connector according to some embodiments of the present disclosure.

FIG. 9c illustrates an exemplary way of connection between an IP camera and a passive connector according to some embodiments of the present disclosure. IP camera 900b may operate in an enhanced mode when Broadreach PHY chip 910 is connected to RJ45 connector 230a through a single pair of lines. Passive converter 930 illustrated in FIG. 9c may be an exemplary embodiment of passive converter 130 illustrated in FIG. 8. Passive converter 930 may include an RJ45 connector 230d, a voltage transformer 920, and a BNC connector 340. RJ45 connector 230d may be connected to RJ45 connector 230a through a single pair of lines. Passive converter 930 may convert a network cable impedance to a coaxial cable impedance so that the signal S (e.g., a video signal) can be transmitted on a coaxial cable. BNC connector 340 may be a coaxial connector and may transmit the video signal S to a coaxial cable. More descriptions regarding the passive converter may be found elsewhere in the present disclosure. See, e.g., FIG. 8 and relevant descriptions thereof.

Merely by way of example, the network cable impedance may be 100 ohms and the coaxial cable impedance is 75 ohms. The turns ratio of voltage transformer 920 may be approximately the square root of 100/75. For example, the turns ratio of voltage transformer 920 may be 8:7. It should be noted that the way of connection between components shown in FIG. 9c is provided for the purposes of illustration, and not intended to limit the scope of the present disclosure. The connection between Broadreach PHY chip 910 and RJ45 connector 230a, or the connection between RJ45 connector 230a and RJ45 connector 230b may different from that illustrated in FIG. 9c. For example, broadreach PHY chip 910 may be connected to any two pins of RJ45 connector 230a. RJ45 connector 230a may be connected to any two pins of RJ45 connector 230b.

Figure 10:
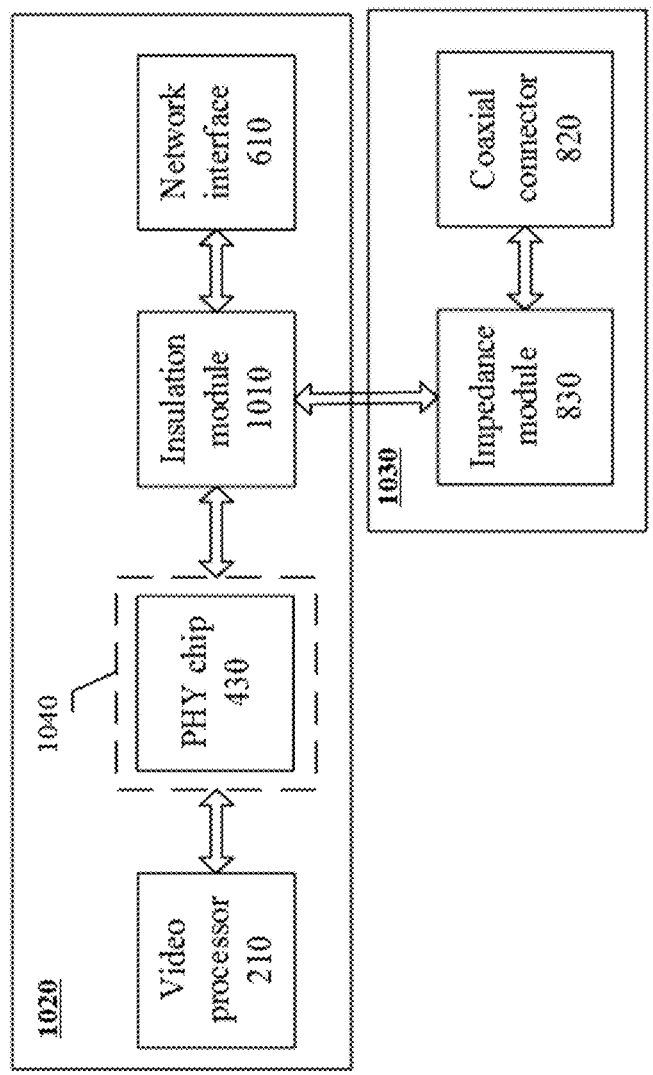
FIG. 10 illustrates a schematic diagram of an exemplary IP camera connected to an exemplary passive converter according to some embodiments of the present disclosure.

FIG. 10 illustrates a schematic diagram of an exemplary IP camera connected to an exemplary passive converter according to some embodiments of the present disclosure. IP camera 1020 may be an exemplary embodiment of IP camera 125 as illustrated in FIG. 1. IP camera 1020 may include a video processor 210, a mode selection module 1040, a network interface 610, and an insulation module 1010. Passive converter 1030 may include an impedance module 830 and a coaxial connector 820. Passive converter 1030 may be an exemplary embodiment of passive converter 130.

Video processor 210 may send a signal S (e.g., a video signal, etc.) to mode selection module 1040. Mode selection module 1040 may select a mode (e.g., a regular mode and an enhanced mode, etc.) for the signal S to be transmitted. Descriptions regarding mode selection techniques may be found in, for example, PCT application No. PCT/CN2017/098124, entitled "SYSTEM AND METHOD FOR ESTABLISHING CONNECTION BETWEEN DEVICES" filed on even date with the present application, the contents of which are hereby incorporated by reference. Merely by way of example, model election module 1040 may select a regular mode or an enhanced mode for the signal S. The signal S in a regular mode may be transmitted over regular Ethernet. The signal S in an enhanced mode may be transmitted over enhanced Ethernet. In some embodiments, mode selection module 1040 may include a PHY chip 430. PHY chip 430 may operate in a regular mode or an enhanced mode. More descriptions regarding the PHY chip 430 may be found elsewhere in the present disclosure. See, e.g., FIG. 6 and relevant descriptions thereof.

Insulation module 1010 may receive a signal (e.g., a video signal) from mode selection module 1040 and transmit the signal to network interface 610. Network interface 610 may be connected to a network cable. Insulation module 1010 may separate mode selection module 1040 and network interface 610 to prevent the network interface 610 from being damaged when receiving the signal. For example, network interface 610 may be damaged by an electrical surge when receiving the signal.

Coaxial connector 820 may be connected to a coaxial cable. Impedance module 830 may convert a network cable impedance to a coaxial cable impedance. In some embodiments, impedance module 830 may be an A:B (e.g., 8:7, 4:3, etc.) voltage transformer or a 100-ohm to 75-ohm Balun. As used herein, A:B may be a turns ratio of the voltage transformer. The turns ratio may be the ratio of turns of a wire in the primary winding to the number of turns of a wire in the secondary winding. More descriptions regarding impedance module and coaxial connector may be found elsewhere in the present disclosure. See, e.g., FIG. 8 and FIG. 9c and relevant descriptions thereof.

It should be noted that the descriptions above in relation to IP camera 1020 and passive converter 1030 are provided for the purposes of illustration, and not intended to limit the scope of the present disclosure. For persons having ordinary skills in the art, various variations and modifications may be conducted under the guidance of the present disclosure. However, those variations and modifications do not depart the scope of the present disclosure. For example, mode selection module 1040, insulation module 1010, network connector 610, and passive converter 1030 may be applied in other types of powered devices including, for example, an IP phone, a notebook computer, etc.

Figure 11A:
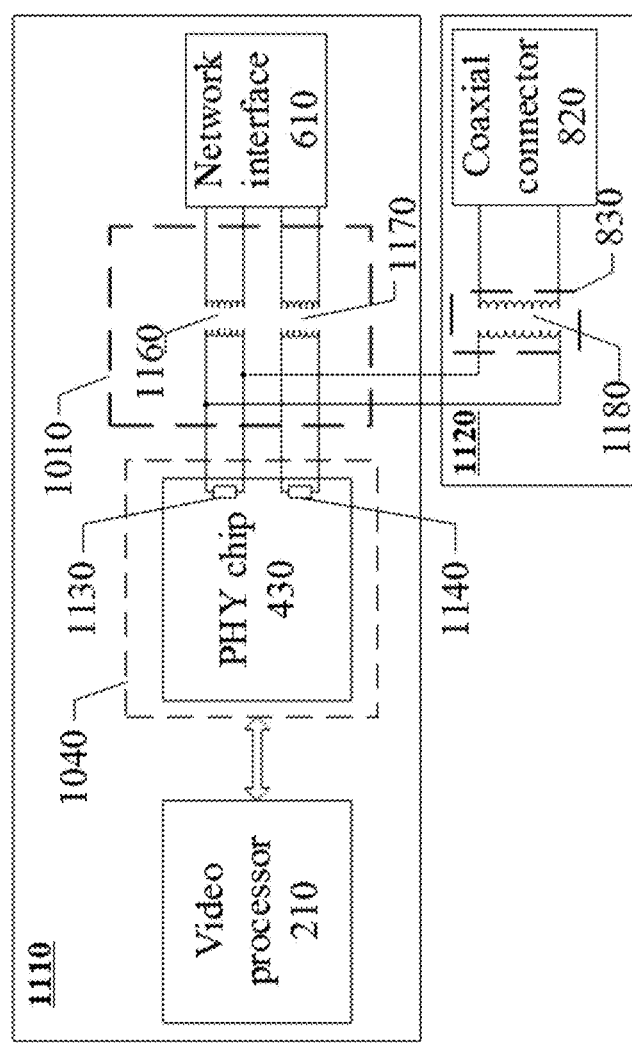
FIG. 11a illustrates an exemplary IP camera connected to an exemplary passive converter according to some embodiments of the present disclosure.

FIG. 11a illustrates an exemplary IP camera connected to an exemplary passive converter according to some embodiments of the present disclosure. IP camera 1110 may be an exemplary embodiment of IP camera 1020 illustrated in FIG. 10. IP camera 1120 may include a video processor 210, a mode selection module 1040, an insulation module 1010, and a network interface 610. Mode selection module 1040 may include a PHY chip 430. PHY chip 430 may include a first resistor 1130 and a second resistor 1140. The resistance of first resistor 1130 and second resistor 1140 may be any positive number. The resistance of first resistor 1130 and the resistance of second resistor 1140 may be the same or different. For instance, both resistances of first resistor 1130 and second resistor 1140 may be 100 ohms.

PHY chip 430 may support both a regular Ethernet connection and an enhanced Ethernet connection. PHY chip 430 may operate in a regular mode and an enhanced mode. When PHY chip 430 operates in the regular mode, PHY chip 430 may be connected to network interface 610 by a single pair of lines. PHY chip 430 may transmit signal S to network interface 610 through first resistor 1130 and first voltage transformer 1160. In this case, signal S may be transmitted over regular Ethernet. When PHY chip 430 operates in the enhanced mode, PHY chip 430 may be connected to network interface 610 by two pairs of lines. PHY chip 430 may transmit signal S to network interface 610 through first resistor 1130 and first voltage transformer 1160, second resistor 1140 and second voltage transformer 1170, respectively. In this case, signal S may be transmitted over enhanced Ethernet. In some embodiments, PHY chip 430 may be an interface chip (e.g., a broadreach PHY chip).

Insulation module 1010 may include a first voltage transformer 1160 and a second voltage transformer 1170. First voltage transformer 1160 may include a first winding and a second winding. A first end and a second end of the first winding of first voltage transformer 1160 may be connected to a first end and a second end of first resistor 1130, respectively. A first end and a second end of the second winding of first voltage transformer 1160 may be connected to network connector 610. A first end and a second end of the first winding of second voltage transformer 1170 may be connected to a first end and a second end of second resistor 1140, respectively. A first end and a second end of the second winding of second voltage transformer 1170 may be connected to network connector 610. In some embodiments, both first voltage transformer 1160 and second voltage transformer 1170 may be 1:1 voltage transformers.

Passive converter 1120 may be an exemplary embodiment of passive converter 1030 as illustrated in FIG. 10. Passive converter 1120 may include an impedance module 830 and a coaxial connector 820. Impedance module 830 may include a third voltage transformer 1180. Third voltage transformer 1180 may include a first winding and a second winding. A first end and a second end of the first winding of third voltage transformer 1180 may be connected to a first end and a second end of the first winding of first voltage transformer 1160, respectively. A first end and a second end of the second winding of third voltage transformer 1180 may be connected to coaxial connector 820.

Coaxial connector 820 may be connected to a terminal device through a coaxial cable. When PHY chip 430 operates in an enhanced mode, PHY chip 430 may transmit signal S to impedance module 830 through first resistor 1130. Impedance module 830 may convert a network cable impedance to a coaxial cable impedance so that signal S may be transmitted on a coaxial cable.

It should be noted that the descriptions above in relation to IP camera 1110 and passive converter 1120 are provided for the purposes of illustration, and not intended to limit the scope of the present disclosure. For persons having ordinary skills in the art, various variations and modifications may be conducted under the guidance of the present disclosure. However, those variations and modifications do not depart the scope of the present disclosure. In some embodiments, mode selection module 1040, insulation module 1010, network connector 610, and passive converter 1120 may be applied in other types of powered devices including, for example, an IP phone, a notebook computer, etc. In some embodiments, first resistor 1130 or second resistor 1140 may be replaced by two or more resistors. For example, the resistance of first resistor 1130 may be 100 ohms. First resistor 1130 may be replaced by two resistors in series the resistance of each of which may be approximately 50 ohms.

Figure 11B:
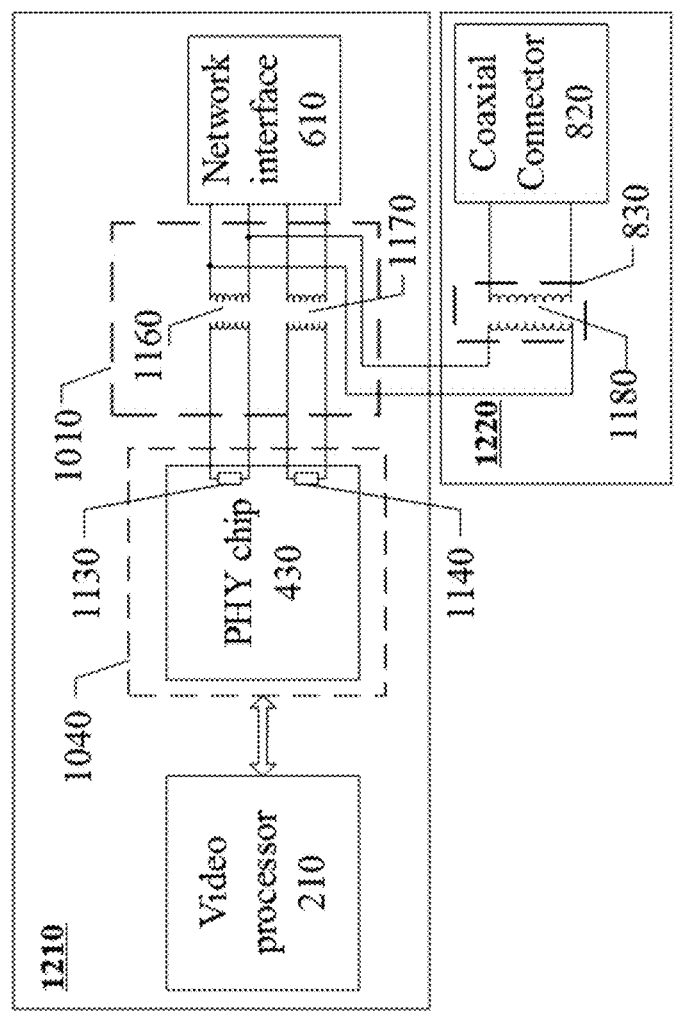
FIG. 11b illustrates an exemplary IP camera connected to an exemplary passive converter according to some embodiments of the present disclosure.

FIG. 11b illustrates an exemplary IP camera connected to an exemplary passive converter according to some embodiments of the present disclosure. IP camera 1210 and passive converter 1220 are similar to IP camera 1110 and passive converter 1120 illustrated in FIG. 11a, except for certain components or features. The way of connection between IP camera 1210 and passive converter 1220 is different from that of IP camera 1110 and passive converter 1120. As shown in FIG. 11a, a first end and a second end of the first winding of third voltage transformer 1180 may be connected to a first end and a second end of the first winding of first voltage transformer 1160, respectively. As shown in FIG. 11b, a first end and a second end of the first winding of third voltage transformer 1180 may be connected to a first end and a second end of the second winding of first voltage transformer 1160, respectively.

Figure 12:
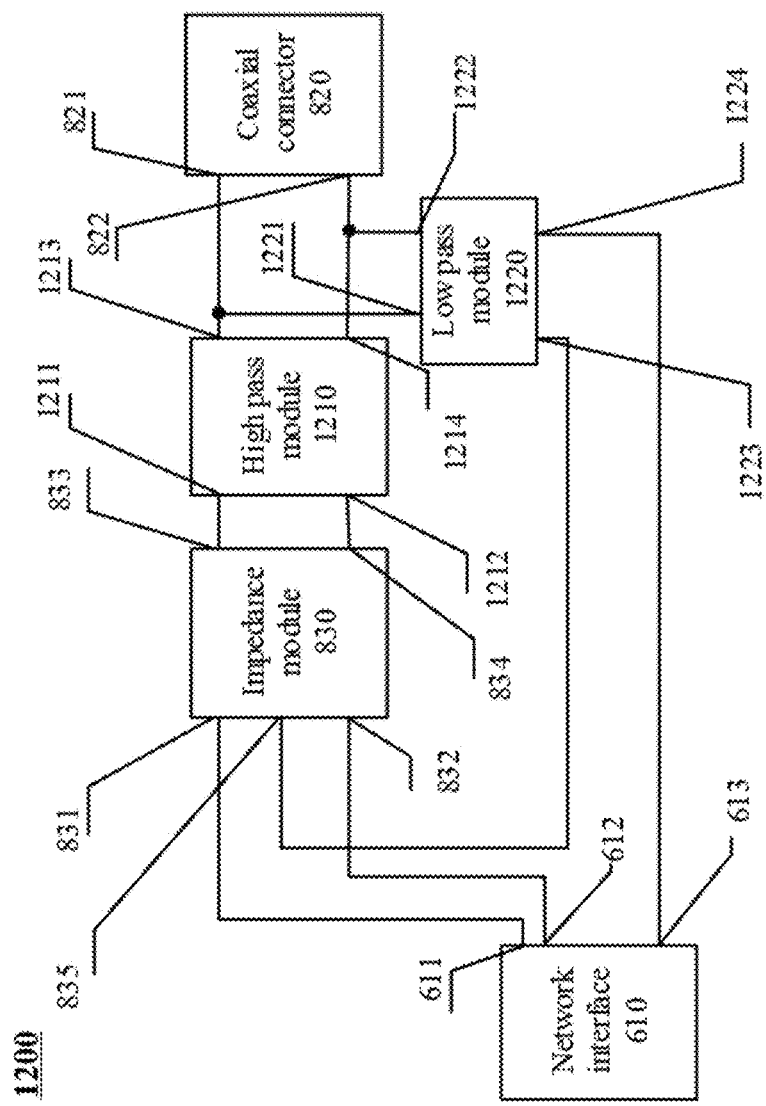
FIG. 12 illustrates a schematic diagram of a passive converter according to some embodiments of the present disclosure.

FIG. 12 illustrates a schematic diagram of a passive converter according to some embodiments of the present disclosure. Passive converter 1200 may be an exemplary embodiment of passive converter 130 as illustrated in FIG. 7.

Passive converter 1200 may include a network interface 610, an impedance module 830, a coaxial connector 820, a high pass module 1210, and a low pass module 1220. Network interface 610 may include one or more interfaces. For example, network interface 610 may include a first interface 611, a second interface 612, and a third interface 613. Impedance module 830 may include one or more ends. For example, impedance module 830 may include a first end 831, a second end 832, a third end 833, a fourth end 834, and a fifth end 835. Coaxial connector 820 may include one or more ends. For example, coaxial connector 820 may include a first end 821 and a second end 822. High pass module 1210 may include one or more ends. For example, high pass module 1210 may include a first end 1211, a second end 1212, a third end 1213, and a fourth end 1214. Low pass module 1220 may include one or more ends. For example, low pass module 1220 may include a first end 1221, a second end 1222, a third end 1223, and a fourth end 1224.

Network interface 610 and coaxial connector 820 may input and/or output one or more signals (e.g., a network signal and/or a direct current signal). Impedance module 830 may convert a network cable impedance to a coaxial cable impedance, or convert a coaxial cable impedance to a network cable impedance. Impedance module 830 may transmit a network signal between network interface 610 and high pass module 1210. High pass module 1210 may transmit the network signal and suppress the direct current signal between impedance module 830 and coaxial connector 820. Low pass module 1220 may transmit the direct current signal and suppress the network signal between impedance module 830 and coaxial connector 820.

Components in passive converter 1200 may be connected to or communicate with each other. First end 831 of impedance module 830 may be connected to first interface 611 of network interface 610. Second end 832 of impedance module 830 may be connected to second interface 612 of network interface 610. Third end 833 of impedance module 830 may be connected to first end 1211 of high pass module 1210. Fourth end 834 of impedance module 830 may be connected to second end 1212 of high pass module 1210.

Third end 1213 of high pass module 1210 may be connected to first end 821 of coaxial connector 820. Fourth end 1214 of high pass module 1210 may be connected to second end 822 of coaxial connector 820. First end 1221 of low pass module 1220 may be connected to the connection between third end 1213 of high pass module 1210 and first end 821 of coaxial connector 820. Second end 1222 of low pass module 1220 may be connected to the connection between fourth end 1214 of high pass module 1210 and second end 822 of coaxial connector 820. Third end 1223 of low pass module 1220 may be connected to fifth end 835 of impedance module 830. Fourth end 1224 of low pass module 1220 may be connected to fourth interface 613 of network interface 610.

Impedance module 830 may be an impedance transformer. For example, impedance module 830 may include a voltage transformer, a Balun, or the like, or a combination thereof. High pass module 1210 may be any device that may transmit a high frequency signal in the PoE system. Merely by way of example, high pass module 1210 may include an electric capacity, a high-pass filter, or the like, or a combination thereof.

The high frequency signal that the high pass module 1210 passes may be any signal that has a higher frequency than a first cut-off frequency signal that it suppresses. As described in connection with FIG. 1, one or more signals may be transmitted in the PoE system. The one or more signals may include but are not limited to a direct current signal, a network signal, a video signal, an image signal, an audio signal. In some embodiments, different types of signals may have different frequency. For example, the network signal may have a higher frequency than a direct current signal. In some embodiments, signals of a same type may have different frequency. For example, a first direct current signal may have a higher frequency than a second direct current signal. In some embodiments, the high frequency signal may refer to the signal whose frequency is higher than 3 MHz.

Low pass module 1220 may be any device that may transmit a low frequency signal in the PoE system. Merely by way of example, low pass module 1220 may include an inductor, a low-pass filter, or the like, or a combination thereof. The low frequency signal that the low pass module 1210 passes may be any signal that has a lower frequency than a second cut-off frequency signal that it suppresses. In some embodiments, the low frequency signal may refer to the signal whose frequency is below 300 kHz. In some embodiments, the low frequency signal may refer to the signal whose frequency is below 1 MHz. The first cut-off frequency signal of the high pass module 1210 and the second cut-off frequency signal of the low pass module 1220 may be same with or different from each other. In some embodiments, the first cut-off frequency may be higher than the second cut-off frequency.

Network interface 610 may be any type of network connector. For example, network interface 610 may be an RJ45 connector. Coaxial connector 820 may be of any type. For example, coaxial connector 820 may be a BNC connector. More descriptions regarding the network connector and coaxial connector may be found elsewhere in the present disclosure. See, e.g., FIG. 6 and FIG. 8 and relevant descriptions thereof.

It should be noted that the descriptions above in relation to passive converter 1200 is provided for the purposes of illustration, and not intended to limit the scope of the present disclosure. For persons having ordinary skills in the art, various variations and modifications may be conducted under the guidance of the present disclosure. However, those variations and modifications do not depart the scope of the present disclosure. For example, any two components of passive converter 1200 may be connected. As another example, network interface 610 may include any number of interfaces (e.g., four, five, six, ten, etc.)

Figure 13:
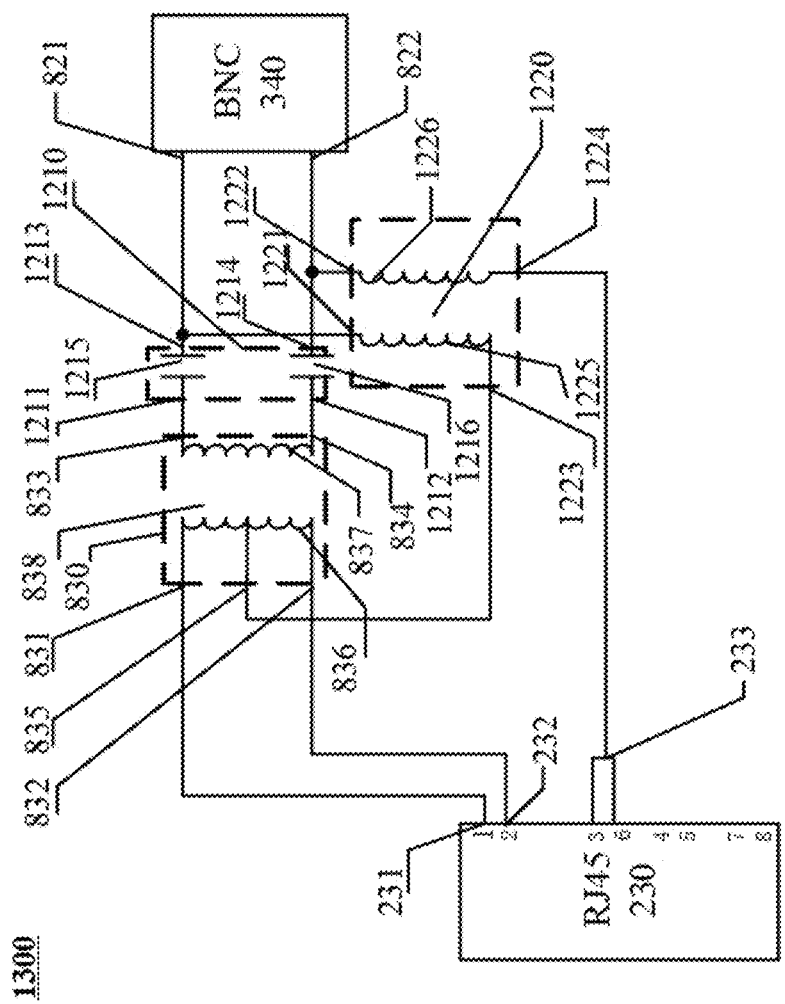
FIG. 13 illustrates an exemplary passive converter according to some embodiments of the present disclosure.

FIG. 13 illustrates an exemplary passive converter according to some embodiments of the present disclosure. Passive converter 1300 may be an exemplary embodiment of passive converter 1200 as illustrated in FIG. 12. Passive converter 1300 may include an RJ45 connector 230, a BNC connector 340, an impedance module 830, a high pass module 1210, and a low pass module 1220.

RJ45 connector 230 may include eight pins (i.e., pin 1 to pin 8). Pin 1 may be a first interface 231 of RJ45 connector 230. Pin 2 may be a second interface 232 of RJ45 connector 230. Pin 3 and pin 6 may be short-circuited to form a fourth interface 233 of RJ45 connector 230.

Impedance module 830 may include a voltage transformer 838. Voltage transformer 838 may include a first winding 836 and a second winding 837. A first end of first winding 836 may be the first end 831 of impedance module 830. A second end of first winding 836 may be the second end 832 of impedance module 830. The mid-tap of first winding 836 may be the fifth end 835 of impedance module 830. A first end of second winding 837 may be the third end 833 of impedance module 830. A second end of second winding 837 may be the fourth end 834 of impedance module 830. The impedance transformation capacity of voltage transformer 838 may be determined by the turns ratio of voltage transformer 838. The impedance transformation capacity of voltage transformer 838 may be independent of the arrangement of first winding 836 and second winding 837.

High pass module 1210 may include a first capacitor 1215 and a second capacitor 1216. A first end of first capacitor 1215 may be the first end 1211 of the high pass module 1210. A second end of first capacitor 1215 may be the third end 1213 of high pass module 1210. A first end of second capacitor 1216 may be the second end 1212 of high pass module 1210. A second end of second capacitor 1216 may be the fourth end 1214 of high pass module 1210.

Low pass module 1220 may include a first inductor 1225 and a second inductor 1226. A first end of first inductor 1225 may be the first end 1221 of low pass module 1220. A second end of first inductor 1225 may be the third end 1223 of low pass module 1220. A first end of second inductor 1226 may be the second end 1222 of low pass module 1220. A second end of second inductor 1226 may be the forth end 1224 of low pass module 1220.

Figure 14:
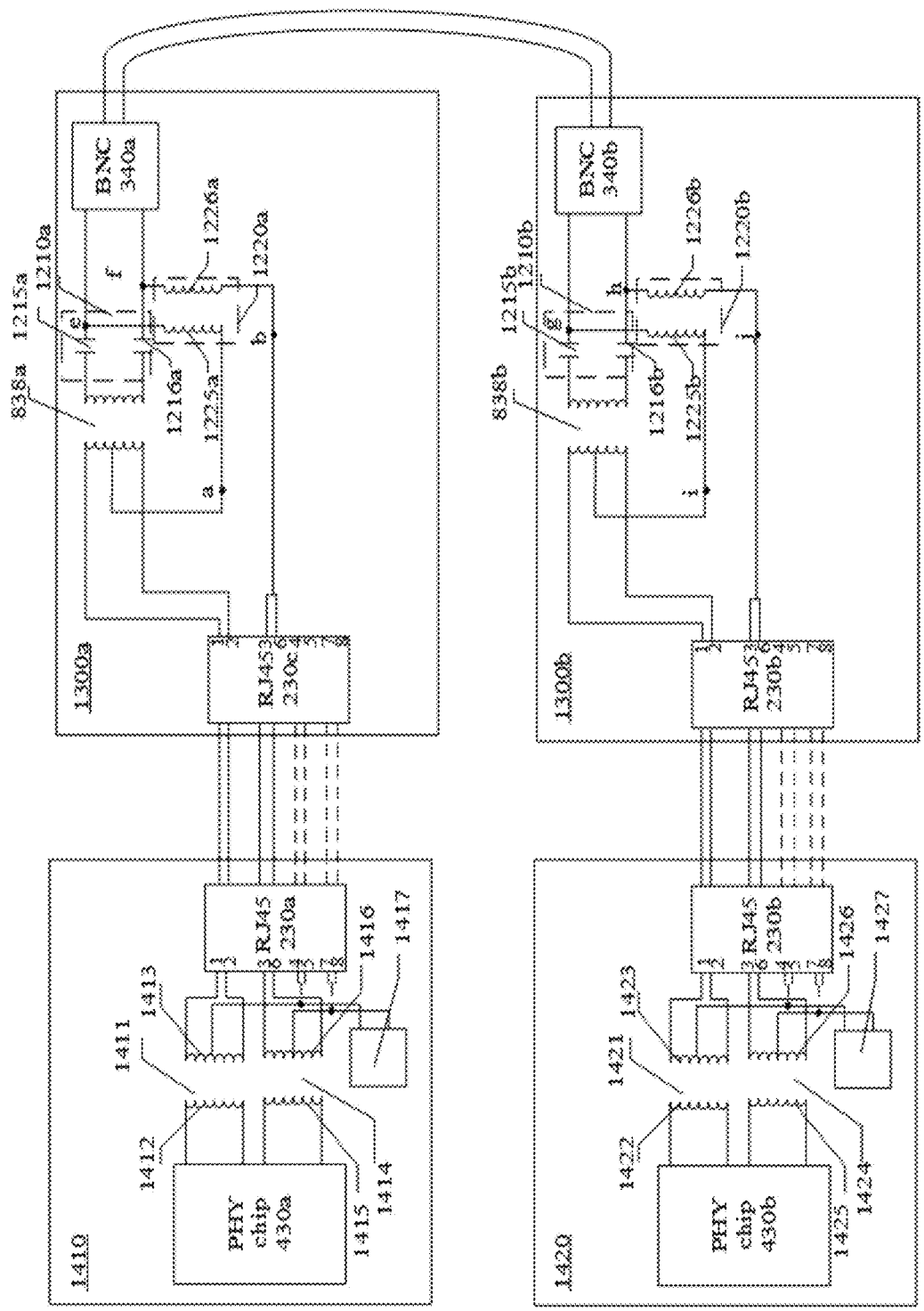
FIG. 14 illustrates an exemplary PoE system according to some embodiments of the present disclosure.

FIG. 14 illustrates an exemplary PoE system according to some embodiments of the present disclosure. PoE system 1400 may include power sourcing equipment 1410, a powered device 1420, and two passive converters, a passive converter 1300*a* and a passive converter 1300*b*. More descriptions regarding a passive converter may be found elsewhere in the present disclosure. See, e.g., FIG. 13 and relevant descriptions thereof.

Power sourcing equipment 1410 may be connected to RJ45 connector 230*c* of passive converter 1300*a* through a network cable. A third end of BNC connector 340*a* of passive converter 1300*a* may be connected to a third end of BNC connector 340*b* of passive converter 1300*b* through a coaxial cable. Powered device 1420 may be connected to RJ45 connector 230*d* of passive converter 1300*b* through a network cable.

Power sourcing equipment 1410 may include a PHY chip 430*a*, a first voltage transformer 1411, a second voltage transformer 1414, a PSE module 1417, and an RJ45 connector 230*a*. In some embodiments, power sourcing equipment 1410 may include a network video recorder (NVE).

RJ45 connector 230*a* may include eight pins (i.e., pin 1 to pin 8). First voltage transformer 1411 may include a first winding 1412 and a second winding 1413. A first end of first winding 1412 may be connected to a first end of PHY chip 430*a*. A second end of first winding 1412 may be connected to a second end of PHY chip 430*a*. A first end of second winding 1413 may be connected to pin 1 of RJ45 connector 230*a*. A second end of second winding 1413 may be connected to pin 2 of RJ45 connector 230*a*.

Second voltage transformer 1414 may include a first winding 1415 and a second winding 1416. A first end of first winding 1415 may be connected to a third end of PHY chip 430*a*. A second end of first winding 1415 may be connected to a fourth end of PHY chip 430*a*. A first end of second winding 1416 may be connected to the pin 3 of RJ45 connector 230*a*. A second end of second winding 1416 may be connected to a second end of pin 6 of RJ45 connector 230*a*.

In some embodiments, a first end of PSE module 1417 may be connected to the mid-tap of second winding 1413 of first voltage transformer 1411. A second end of PSE module 1417 may be connected to the mid-tap of second winding 1416 of second voltage transformer 1414.

In some embodiments, a first end of PSE module 1417 may be connected to the mid-tap of second winding 1413 of first voltage transformer 1411. At the same time, pin 4 and pin 5 of RJ45 connector 230*a* may be short-circuited and connected to the first end of PSE module 1417. A second end of PSE module 1417 may be connected to the mid-tap of second winding 1416 of second voltage transformer 1414. At the same time, pin 7 and pin 8 may be short-circuited and connected to the second end of PSE module 1417.

Powered device 1420 may include a PHY chip 430*b*, a first voltage transformer 1421, a second voltage transformer 1424, a PD module 1427, and an RJ45 connector 230*b*. In some embodiments, powered device 1420 may be an IP camera.

RJ45 connector 230*b* may include eight pins (i.e., pin 1 to pin 8). First voltage transformer 1421 may include a first winding 1422 and a second winding 1423. A first end of first winding 1422 may be connected to a first end of PHY chip 430*b*. A second end of first winding 1422 may be connected to a second end of PHY chip 430*b*. A first end of second winding 1423 may be connected to pin 1 of RJ45 connector 230*b*. A second end of second winding 1423 may be connected to pin 2 of RJ45 connector 230*b*.

Second voltage transformer 1424 may include a first winding 1425 and a second winding 1426. A first end of first winding 1425 may be connected to a third end of PHY chip 430*b*. A second end of first winding 1425 may be connected to a fourth end of PHY chip 430*b*. A first end of second winding 1426 may be connected to pin 3 of RJ45 connector 230b. A second end of second winding 1426 may be connected to a second end of pin 6 of RJ45 connector 230b.

In some embodiments, a first end of PD module 1427 may be connected to the mid-tap of second winding 1423 of first voltage transformer 1421. A second end of PSE module 1427 may be connected to the mid-tap of second winding 1426 of second voltage transformer 1424. In some embodiments, a first end of PD module 1427 may be connected to the mid-tap of second winding 1423 of first voltage transformer 1421. At the same time, pin 4 and pin 5 of RJ45 connector 230b may be short-circuited and connected to the first end of PD module 1427. A second end of PD module 1427 may be connected to the mid-tap of second winding 1426 of second voltage transformer 1424. At the same time, pin 7 and pin 8 may be short-circuited and connected to the second end of PD module 1427.

Power sourcing equipment 1410 may output a direct current signal. The direct current signal may include a positive direct current signal and a negative direct current signal. The positive direct current signal may be transmitted to the pair of lines 1 and 2 of RJ45 connector 230a in a regular mode. The negative direct current signal may be transmitted to the pair of lines 3 and 6 of RJ45 connector 230a in a regular mode. PHY chip 430a may operate in an enhanced mode. A network signal may be transmitted on pair of lines 1 and 2 of RJ45 connector 230a.

The direct current signal transmitted by the pair of lines 1 and 2 of RJ45 connector 230c may go through the mid-tap of voltage transformer 838a and be transmitted to first inductor 1225a of low pass module 1220a. Pin 3 and pin 6 of RJ45 connector 230c may be short-circuited and connected to second inductor 1226a of low pass module 1220a. As shown in FIG. 13, the direct current signal supplied by power sourcing equipment 1410 may be transmitted to point a and point b.

First inductor 1225a and second inductor 1226a of low pass module 1220a may suppress a high frequency signal and transmit a low frequency signal. Therefore, the ripple wave of the direct current signal may be suppressed and a low frequency direct current signal may be transmitted through low pass module 1220a. As shown in FIG. 13, the low frequency direct current signal supplied by power sourcing equipment 1410 may be transmitted to point e and point f.

The network signal transmitted by pair of lines 1 and 2 of RJ45 connector 230c may go through voltage transformer 838a and the network cable impedance may be converted. The impedance capacity of voltage transformer 838a may be determined by the turns ratio of voltage transformer 838a. Merely by way of example, a network cable impedance of 100 ohms may be converted to a coaxial cable impedance of 75 ohms when the turns ratio of voltage transformer 838a equals to the square root of 100/75 (i.e., approximately 8/7).

The network signal transmitted through voltage transformer 838a may then pass first capacitor 1215a and second capacitor 1216a of high pass module 1210a. First capacitor 1215a and second capacitor 1216a may suppress a low frequency signal and transmit a high frequency signal. The network signal, a high frequency direct current signal, may be transmitted to point e and point f through high pass module 1210a. The low frequency direct current signal transmitted through low pass module 1220a may not be transmitted through high pass module 1210a. The low frequency direct current signal transmitted through low pass module 1220a and the network signal transmitted through high pass module 1210a may then pass point e and point f and be transmitted to BNC connector 340a.

The low direct current signal and the network signal may be transmitted to passive converter 1300b through a coaxial cable. The two signals may be transmitted through passive converter 1300b in a same pattern as they are transmitted in passive converter 1300a but in a reverse direction. The low direct current signal at point g and point h may be transmitted to point i and point j through low pass module 1220b and may not pass high pass module 1210b. The low direct current signal at point i may pass the mid-tap of voltage transformer 838b and be transmitted to the pair of lines 1 and 2 of RJ45 connector 230d. The low direct current signal at point j may be transmitted to the pair of lines 3 and 6 of RJ45 connector 230d. The network signal may not be transmitted to point i and point j because low pass module 1220b may suppress the high frequency signal. The network signal may pass high pass module 1210b and be transmitted to voltage transformer 838b. The network cable impedance may be converted to the coaxial cable impedance by voltage transformer 838b. The network signal may then be transmitted to PHY chip 430b through the pair of lines 1 and 2 of RJ45 connector 230d and RJ45 connector 230b.

Figure 15:
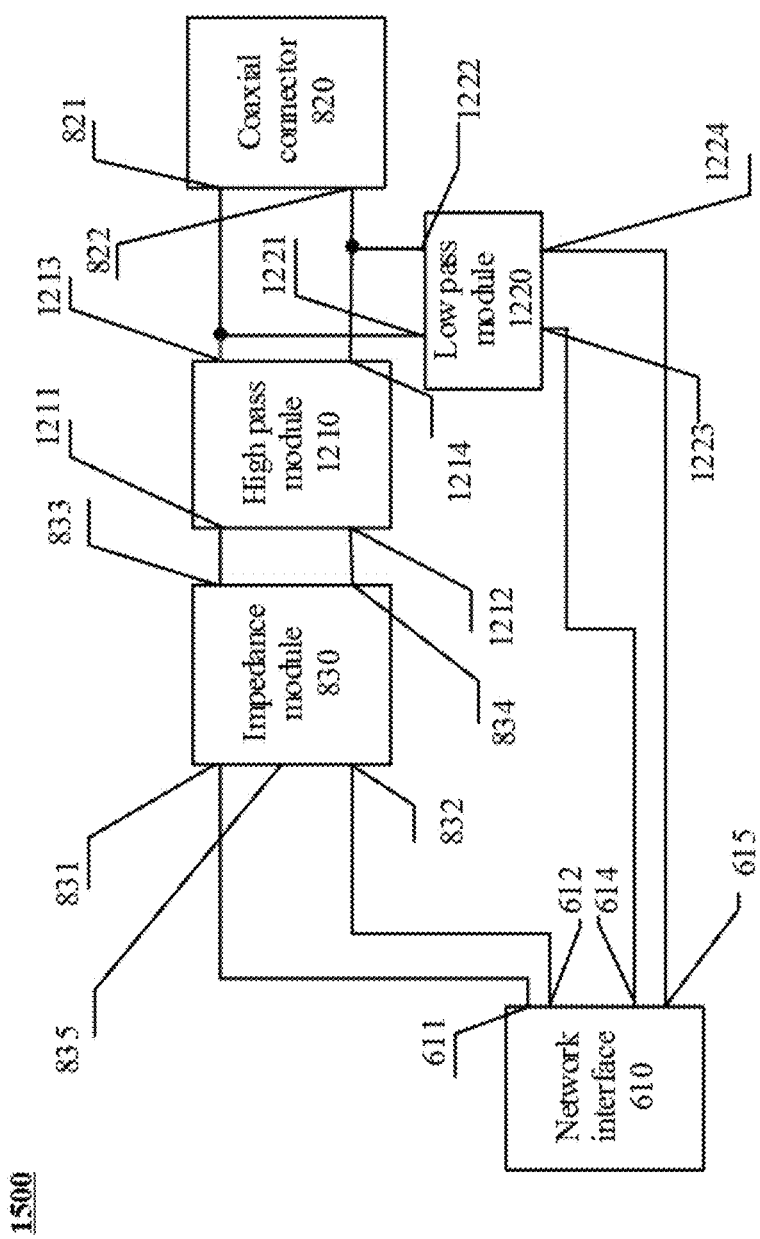
FIG. 15 illustrates a schematic diagram of a passive converter according to some embodiments of the present disclosure.

FIG. 15 illustrates a schematic diagram of a passive converter according to some embodiments of the present disclosure. Passive converter 1500 illustrated in FIG. 15 is similar to passive converter 1200 illustrated in FIG. 12, except for certain components or features. Passive converter 1500 may be an exemplary embodiment of passive converter 130 as illustrated in FIG. 7.

In passive converter 1500, third end 1223 of low pass module 1220 may be connected to third interface 614 of network interface 610. Fourth end 1224 of low pass module 1220 may be connected to fifth interface 615 of network interface 610.

Figure 16:
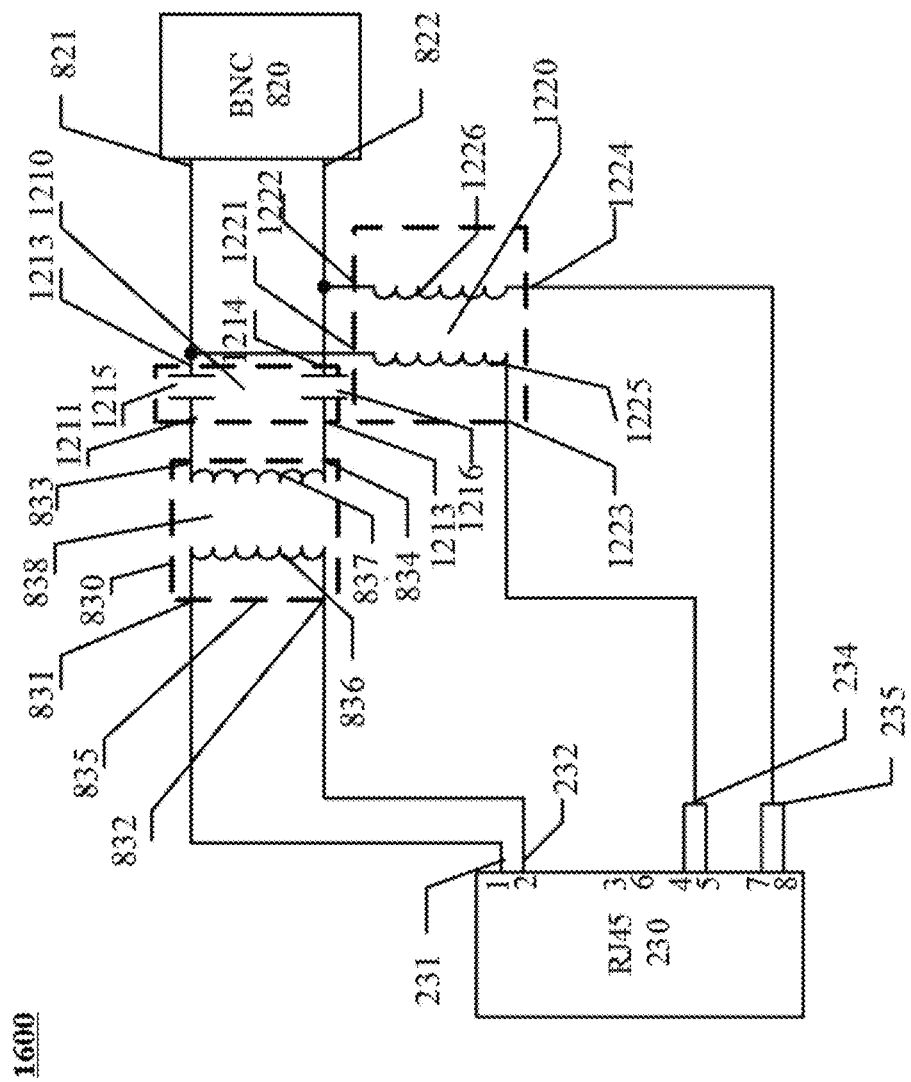
FIG. 16 illustrates an exemplary passive converter according to some embodiments of the present disclosure.

FIG. 16 illustrates an exemplary passive converter according to some embodiments of the present disclosure. Passive converter 1600 may be an exemplary embodiment of passive converter 1500 as illustrated in FIG. 15. As shown in FIG. 16, RJ45 connector 230 may have 8 pins (i.e., pin 1 to pin 8). Pin 1 may be a first interface 231 of RJ45 connector 230. Pin 2 may be a second interface 232 of RJ45 connector 230. Pin 4 and pin 5 may be short-circuited to form a third interface 234 of RJ45 connector 230. Pin 7 and pin 8 may be short-circuited to form a fifth interface 235 of RJ45 connector 230.

Figure 17:
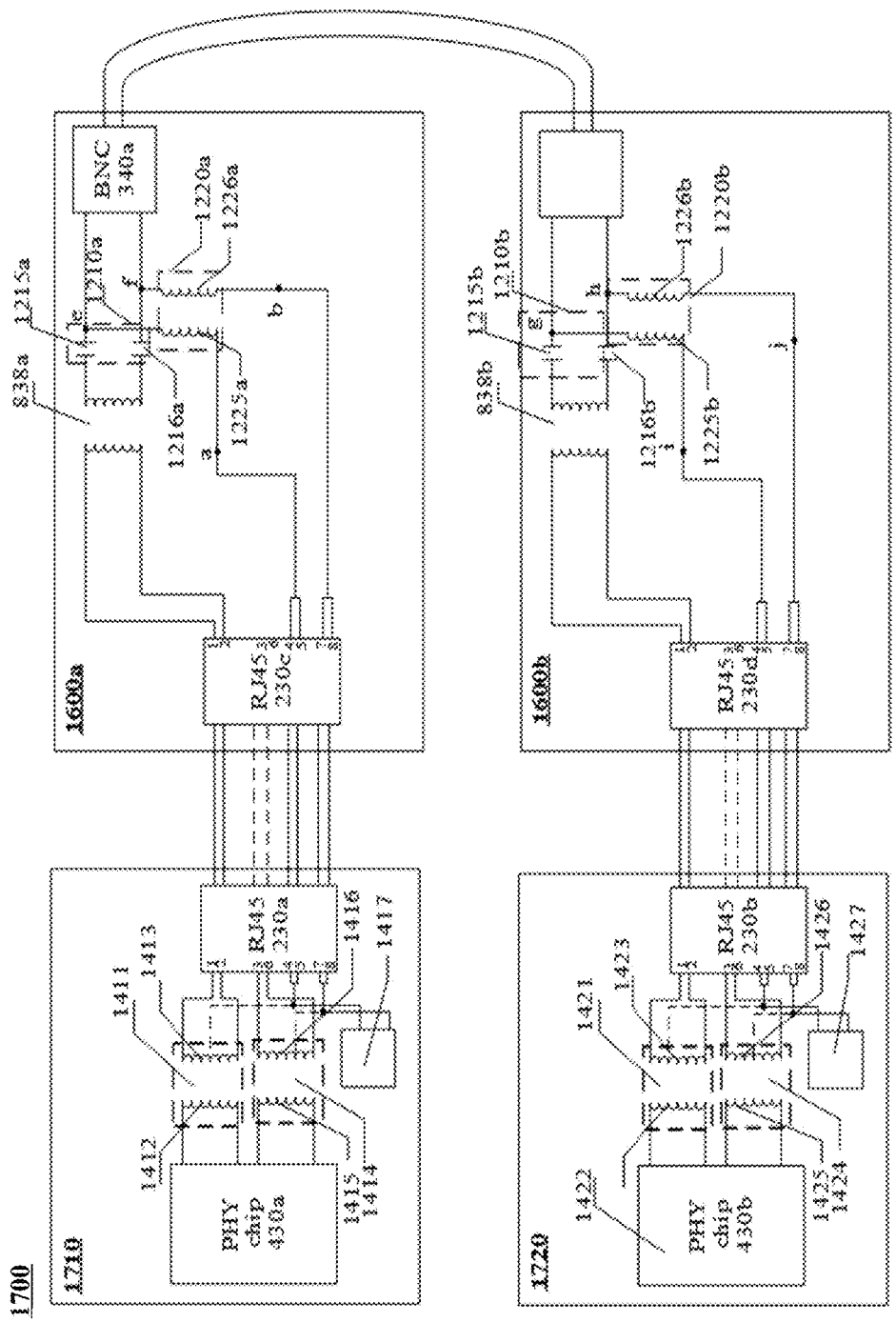
FIG. 17 illustrates an exemplary PoE system according to some embodiments of the present disclosure.

FIG. 17 illustrates an exemplary PoE system according to some embodiments of the present disclosure. PoE system 1700 may include power sourcing equipment 1710, a powered device 1720, and two passive converters 1600 (i.e., a passive converter 1600a and a passive converter 1600b). PoE system 1700 illustrated in FIG. 17 is similar to PoE system 1400 illustrated in FIG. 14, except for certain components or features. Power sourcing equipment 1710 may be an exemplary embodiment of power sourcing equipment 110 as illustrated in FIG. 7. Powered device 1720 may be an exemplary embodiment of powered device 120 as illustrated in FIG. 7.

In some embodiments, pin 4 and pin 5 of RJ45 connector 230a may be short-circuited and be connected to a first end of PSE module 1417 of power sourcing equipment 1710. Pin 7 and pin 8 of RJ45 connector 230a may be short-circuited and be connected to a second end of PSE module 1417. In some embodiments, the first end of PSE module 1417 in power sourcing equipment 1710 may be connected to the mid-tap of second winding 1413 of first voltage transformer 1411. At the same time, pin 4 and pin 5 of RJ45 connector 230a may be short-circuited and be connected to the first end of PSE module 1417. The second end of PSE module 1417 in power sourcing equipment 1710 may be connected to the mid-tap of second winding 1416 of second voltage transformer 1414. At the same time, pin 7 and pin 8 of RJ45 connector 230a may be short-circuited and be connected to the second end of PSE module 1417.

In some embodiments, pin 4 and pin 5 of RJ45 connector 230b may be short-circuited and be connected to the first end of PD module 1427 in powered device 1720. Pin 7 and pin 8 of RJ45 connector 230b may be short-circuited and be connected to the second end of PD module 1427. In some embodiments, the first end of PD module 1427 in powered device 1720 may be connected to the mid-tap of second winding 1423 of first voltage transformer 1421. At the same time, pin 4 and pin 5 of RJ45 connector 230b may be short-circuited and be connected to the first end of PD module 1427. The second end of PD module 1427 in powered device 1720 may be connected to the mid-tap of second winding 1426 of second voltage transformer 1424. At the same time, pin 7 and pin 8 of RJ45 connector 230b may be short-circuited and be connected to the second end of PD module 1427.

Figure 18:
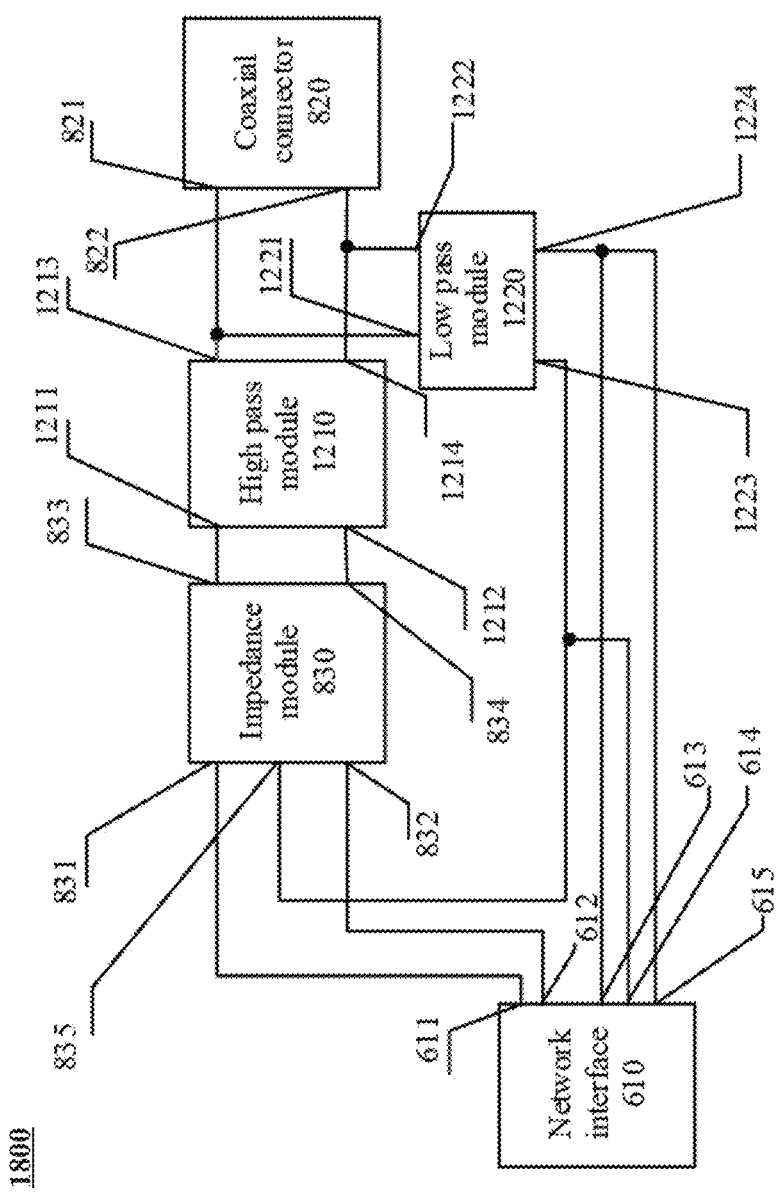
FIG. 18 illustrates a schematic diagram of a passive converter according to some embodiments of the present disclosure.

FIG. 18 illustrates a schematic diagram of a passive converter according to some embodiments of the present disclosure. Passive converter 1800 illustrated in FIG. 18 is similar to passive converter 1200 illustrated in FIG. 12, except for certain components or features.

In passive converter 1800, third end 1223 of low pass module 1220 may be connected to fifth end 835 of impedance module 830 and third interface 614 of network interface 610. Fourth end 1224 of low pass module 1220 may be connected to fourth interface 613 and fifth interface 615 of network interface 610.

Figure 19:
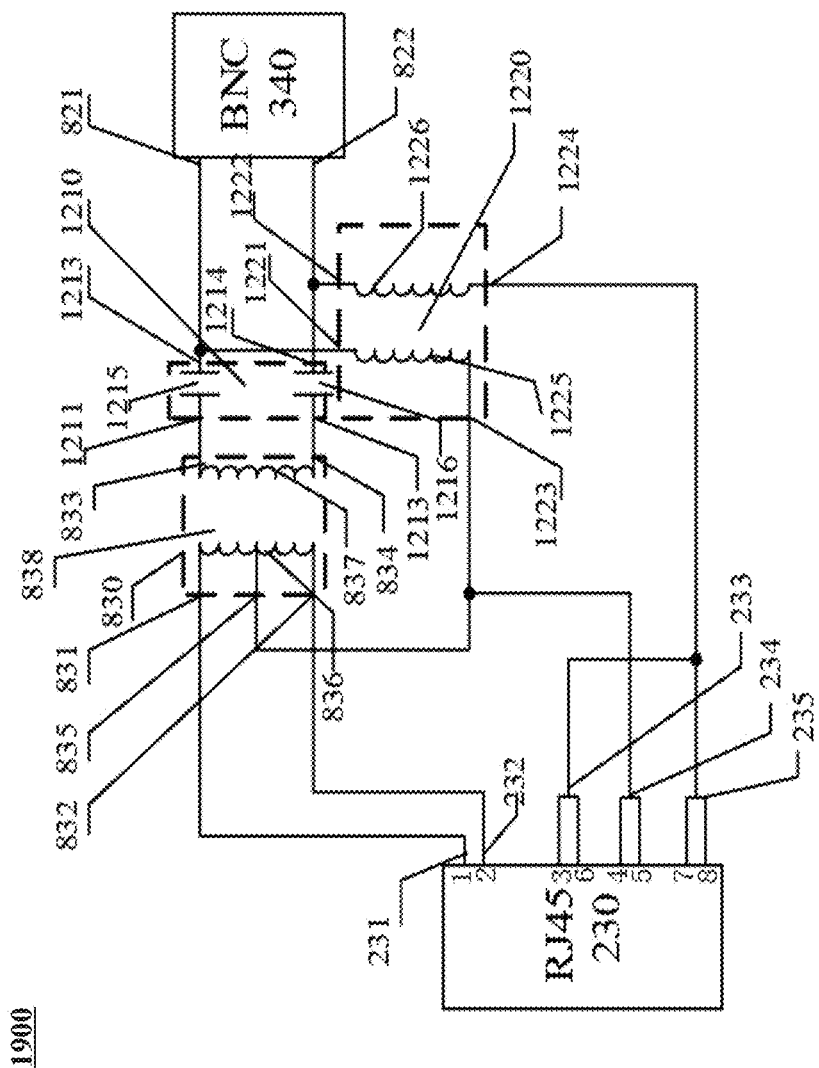
FIG. 19 illustrates an exemplary passive converter according to some embodiments of the present disclosure.

FIG. 19 illustrates an exemplary passive converter according to some embodiments of the present disclosure. Passive converter 1900 may be an exemplary embodiment of passive converter 1800 as illustrated in FIG. 18.

As shown in FIG. 19, RJ45 connector 230 may have 8 pins (i.e., pin 1 to pin 8). Pin 1 may be a first interface 231 of RJ45 connector 230. Pin 2 may be a second interface 232 of RJ45 connector 230. Pin 3 and pin 6 may be short-circuited to form a fourth interface 233 of RJ45 connector 230. Pin 4 and pin 5 may be short-circuited to form a third interface 234 of RJ45 connector 230. Pin 7 and pin 8 may be short-circuited to form a fifth interface 235 of RJ45 connector 230.

Figure 20:
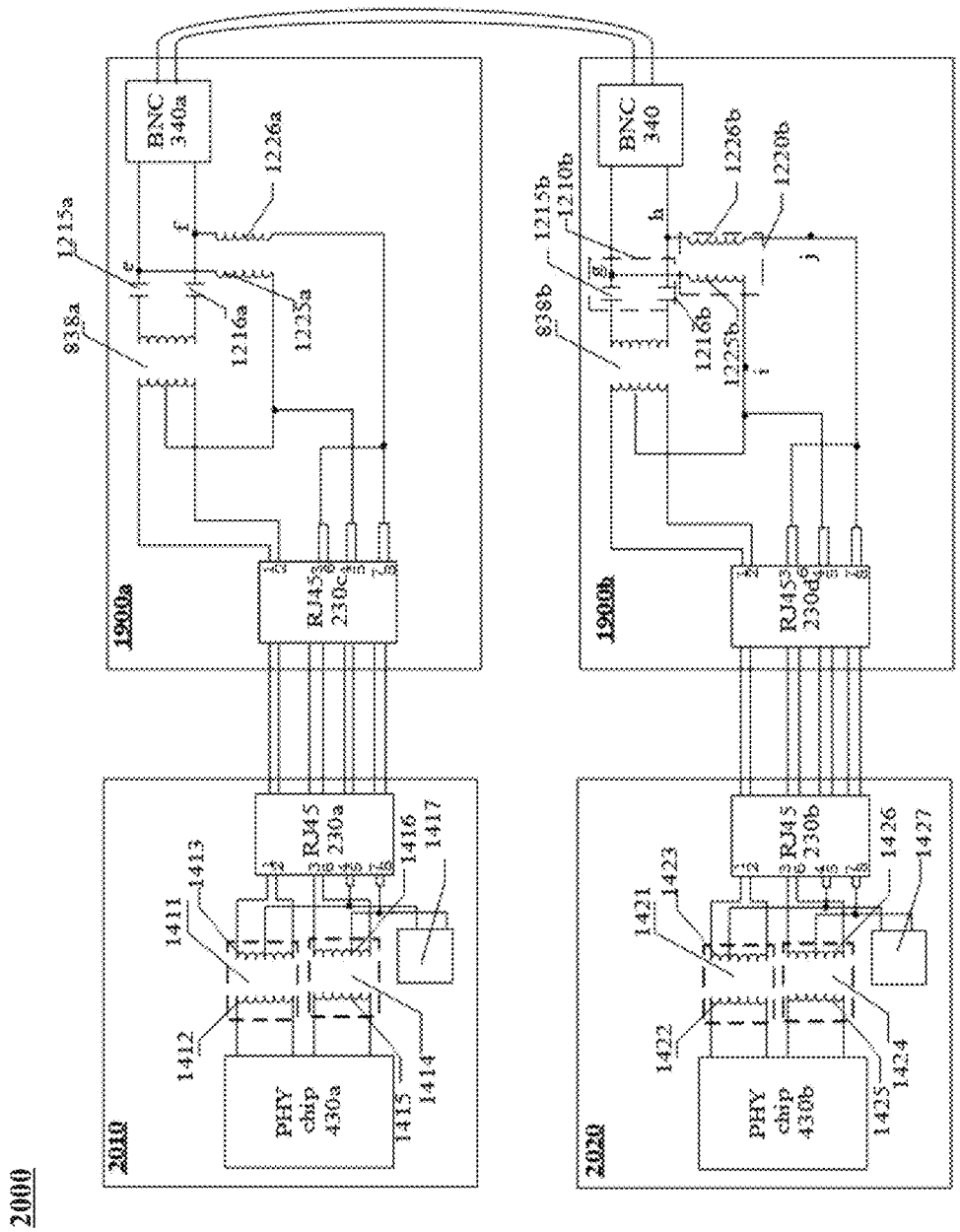
FIG. 20 illustrates an exemplary PoE system according to some embodiments of the present disclosure.

FIG. 20 illustrates an exemplary PoE system according to some embodiments of the present disclosure. PoE system 2000 may include power sourcing equipment 2010, a powered device 2020, and two passive converters 1800 (i.e., a passive converter 1800a and a passive converter 1800b). PoE system 2000 illustrated in FIG. 20 is similar to PoE system 1400 illustrated in FIG. 14, except for certain components or features.

A first end of PSE module 1417 in power sourcing equipment 2010 may be connected to the mid-tap of second winding 1413 of first voltage transformer 1411. At the same time, pin 4 and pin 5 of RJ45 connector 230a may be short-circuited and be connected to the first end of PSE module 1417. A second end of PSE module 1417 in power sourcing equipment 2010 may be connected to the mid-tap of second winding 1416 of second voltage transformer 1414. At the same time, pin 7 and pin 8 of RJ45 connector 230a may be short-circuited and be connected to the second end of PSE module 1417.

A first end of PD module 1427 in powered device 2020 may be connected to the mid-tap of second winding 1423 of first voltage transformer 1421. At the same time, pin 4 and pin 5 of RJ45 connector 230b may be short-circuited and be connected to the first end of PD module 1427. A second end of PD module 1427 in powered device 2020 may be connected to the mid-tap of second winding 1426 of second voltage transformer 1424. At the same time, pin 7 and pin 8 of RJ45 connector 230b may be short-circuited and be connected to the second end of PD module 1427. In some embodiments, the direct current signal may be transmitted through the pairs of lines 1 and 2, 3 and 6, 4 and 5, and 7 and 8 in a regular mode.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "block," "module," "engine," "unit," "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the operator's computer, partly on the operator's computer, as a stand-alone software package, partly on the operator's computer and partly on a remote computer or entirely on the remote computer or server. In the latter scenario, the remote computer may be connected to the operator's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities of ingredients, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the descriptions, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

I claim:

1. A passive converter comprising:
   a first connector configured to transmit one or more signals, wherein the first connector is a first network connector, the one or more signals include a first signal and a second signal;
   a second connector configured to receive the one or more signals, wherein the second connector is a coaxial connector;
   a first cable with a first impedance, wherein the first cable is a network cable, and the first impedance is a network cable impedance;
   a second cable with a second impedance, wherein the second cable is a first coaxial cable, and the second impedance is a coaxial cable impedance;
   an impedance module, wherein
      the first connector is connected to the impedance module via the first cable;
      the second connector is connected to the impedance module via the second cable; and
      the impedance module is configured to convert, without power supply, the first impedance of the first cable to the second impedance of the second cable such that the one or more signals are transmitted from the first connector to the second connector via the first cable and the second cable; and
   a high pass module configured to transmit the second signal between the impedance module and the coaxial connector and suppress the first signal between the impedance module and the coaxial connector.

2. The converter of claim 1, wherein the first signal is a power signal and the second signal is a network signal.

3. The converter of claim 2, further comprising a low pass module, wherein:
   the low pass module is configured to transmit the power signal between the impedance module and the coaxial connector and suppress the network signal between the impedance module and the coaxial connector.

4. The converter of claim 3, wherein:
the first network connector comprises a first interface and a second interface;
the impedance module comprises a first end of the impedance module, a second end of the impedance module, a third end of the impedance module, and a fourth end of the impedance module; and
the high pass module comprises a first end of the high pass module and a second end of the high pass module, and wherein
the first end of the impedance module is connected with the first interface of the first network connector, the second end of the impedance module is connected with the second interface of the first network connector, the third end of the impedance module is connected with the first end of the high pass module, and the fourth end of the impedance module is connected with the second end of the high pass module.

5. The converter of claim 4, wherein:
the first network connector further comprises a third interface, a fourth interface, and a fifth interface;
the impedance module further comprises a fifth end of the impedance module;
the coaxial connector comprises a first end of the coaxial connector and a second end of the coaxial connector;
the high pass module further comprises a third end of the high pass module and a fourth end of the high pass module; and
the low pass module further comprises a first end of the low pass module, a second end of the low pass module, a third end of the low pass module, and a fourth end of the low pass module, and wherein
the first end of the low pass module is connected to a connection between the third end of the high pass module and the first end of the coaxial connector, the second end of the low pass module is connected to a connection between the fourth end of the high pass module and the second end of the coaxial connector, the third end of the low pass module is connected to the fifth end of the impedance module or the third interface of the first network connector, and the fourth end of the low pass module is connected to the fourth interface or the fifth interface of the first network connector.

6. The converter of claim 5, wherein:
the first network connector comprises an RJ45 connector including a first pin, a second pin, a third pin, a fourth pin, a fifth pin, a sixth pin, a seventh pin, and an eighth pin; and wherein
the first pin forms the first interface of the first network connector, the second pin forms the second interface of the first network connector, the fourth pin and the fifth pin are short-circuited to form the third interface of the first network connector, the third pin and the sixth pin are short-circuited to form the fourth interface of the first network connector, and the seventh pin and the eighth pin are short-circuited to form the fifth interface of the first network connector.

7. The converter of claim 6, wherein
the impedance module comprises a voltage transformer including a first winding and a second winding,
the first winding comprises a first end of the first winding, a second end of the first winding, and a mid-tap of the first winding, and
the second winding comprises a first end of the second winding and a second end of the second winding, and wherein:
the first end of the first winding forms the first end of the impedance module, the second end of the first winding forms the second end of the impedance module, the mid-tap of the first winding forms the fifth end of the impedance module; and
the first end of the second winding forms the third end of the impedance module, and the second end of the second winding forms the fourth end of the impedance module.

8. The converter of claim 7, wherein
the high pass module comprises a first capacitor and a second capacitor,
the first capacitor comprises a first end of the first capacitor and a second end of the first capacitor,
the second capacitor comprises a first end of the second capacitor and a second end of the second capacitor, and wherein:
the first end of the first capacitor forms the first end of the high pass module,
the second end of the first capacitor forms the third end of the high pass module,
the first end of the second capacitor forms the second end of the high pass module, and
the second end of the second capacitor forms the fourth end of the high pass module.

9. The converter of claim 3, wherein:
the high pass module comprises a sixth end of the high pass module and a seventh end of the high pass module;
the coaxial connector comprises a third end of the coaxial connector and a fourth end of the coaxial connector, and wherein
the sixth end of the high pass module is connected to the third end of the coaxial connector; and
the seventh end of the high pass module is connected to the fourth end of the coaxial connector.

10. The converter of claim 3, wherein
the low pass module comprises a first inductor and a second inductor,
the first inductor comprises a first end of the first inductor and a second end of the first inductor,
the second inductor comprises a first end of the second inductor and a second end of the second inductor,
the low pass module comprises a fifth end of the low pass module, a sixth end of the low pass module, a seventh end of the low pass module, and an eighth end of the low pass module and wherein:
the first end of the first inductor forms the fifth end of the low pass module, the first end of the second inductor forms the sixth end of the low pass module, the second end of the first inductor forms the seventh end of the low pass module, and the second end of the second inductor forms the eighth end of the low pass module and wherein:
the fifth end of the low pass module and the sixth end of the low pass module are coupled to the first network connector, and
the seventh end of the low pass module and the eighth end of the low pass module are coupled to the coaxial connector.

11. The converter of claim 1, wherein the first network connector of the converter is connected to an IP camera, and wherein the IP camera comprises a video processor, a physical layer chip, and a second network connector.

12. A Power over Ethernet system comprising:
a first passive converter that comprises a first connector configured to transmit one or more signals, a second connector configured to receive the one or more signals, a first cable with a first impedance, a second cable with a second impedance, a first impedance module, a high pass module;

a second passive converter that comprises a third connector configured to transmit one or more signals, a fourth connector configured to receive the one or more signals, a third cable with a third impedance, a fourth cable with a fourth impedance, and a second impedance module, and wherein:

the one or more signals include a first signal and a second signal;

the first connector and the third connector are network connectors;

the second connector and the fourth connector are coaxial connectors;

the first cable and the third cable are network cables;

the second cable, the fourth cable, and a fifth cable are coaxial cables;

the first impedance and the third impedance are network cable impedances;

the second impedance and the fourth connector are coaxial cable impedances;

the first connector is connected to the first impedance module via the first cable;

the second connector is connected to the first impedance module via the second cable;

the first impedance module is configured to convert, without power supply, the first impedance of the first cable to the second impedance of the second cable such that the one or more signals are transmitted from the first connector to the second connector via the first cable and the second cable;

the high pass module is configured to transmit the second signal between the first impedance module and the coaxial connector and suppress the first signal between the first impedance module and the coaxial connector;

the third connector is connected to the second impedance module via the third cable;

the fourth connector is connected to the second impedance module via the fourth cable; and the second impedance module is configured to convert, without power supply, the third impedance of the third cable to the fourth impedance of the fourth cable such that the one or more signals are transmitted from the third connector to the fourth connector via the third cable and the fourth cable; and an end of the second connector of the first converter is connected to an end of the fourth connector of the second converter via the fifth cable.

13. The Power over Ethernet system of claim 12, further comprising:

power sourcing equipment;

a powered device, wherein the power sourcing equipment is connected to the first connector of the first converter by a sixth cable; and the powered device is connected to the third connector of the second converter by a seventh cable.

14. An IP camera comprising a video processor, a physical layer chip, and a network connector, wherein the physical layer chip has a regular mode and an enhanced mode, the physical layer chip operates in the regular mode when the physical layer chip is connected to a standard network cable, and the physical layer chip operates in the enhanced mode when the physical layer chip is connected to an enhanced network cable; and the IP camera is connected to a passive converter, wherein the converter comprises:

a first connector configured to transmit one or more signals, wherein the first connector is a first network connector, the one or more signals include a first signal and a second signal;

a second connector configured to receive the one or more signals, wherein the second connector is a coaxial connector;

a first cable with a first impedance, wherein the first cable is a network cable, the first impedance is a network cable impedance;

a second cable with a second impedance, wherein the second cable is a first coaxial cable, the second impedance is a coaxial cable impedance;

an impedance module, wherein the first connector is connected to the impedance module via the first cable;

the second connector is connected to the impedance module via the second cable; and the impedance module is configured to convert, without power supply, the first impedance of the first cable to the second impedance of the second cable such that the one or more signals are transmitted from the first connector to the second connector via the first cable and the second cable; and a high pass module configured to transmit the second signal between the impedance module and the coaxial connector and suppress the first signal between the impedance module and the coaxial connector.

15. The IP camera of claim 14, wherein the physical layer chip operates in the regular mode when the physical layer chip of the IP camera is connected to the network connector by four pairs of lines.

16. The IP camera of claim 14, wherein the physical layer chip operates in the enhanced mode when the physical layer chip of the IP camera is connected to the network connector by a pair of lines.

17. An IP camera of claim 14, wherein the first signal is a power signal and the second signal is a network signal.

* * * * *